(12) United States Patent
Then et al.

(10) Patent No.: US 11,387,329 B2
(45) Date of Patent: Jul. 12, 2022

(54) TRI-GATE ARCHITECTURE MULTI-NANOWIRE CONFINED TRANSISTOR

(71) Applicant: Intel Corporation, Santa Clara, CA (US)

(72) Inventors: Han Wui Then, Portland, OR (US); Marko Radosavljevic, Portland, OR (US); Sansaptak Dasgupta, Hillsboro, OR (US); Paul Fischer, Portland, OR (US); Walid Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 775 days.

(21) Appl. No.: 16/147,275

(22) Filed: Sep. 28, 2018

(65) Prior Publication Data
US 2020/0105882 A1    Apr. 2, 2020

(51) Int. Cl.
| | |
|---|---|
| *H01L 29/20* | (2006.01) |
| *H01L 29/78* | (2006.01) |
| *H01L 29/66* | (2006.01) |
| *H01L 29/06* | (2006.01) |
| *H01L 29/51* | (2006.01) |
| *H01L 27/088* | (2006.01) |
| *H01L 29/778* | (2006.01) |

(52) U.S. Cl.
CPC ...... *H01L 29/2003* (2013.01); *H01L 27/0886* (2013.01); *H01L 29/0673* (2013.01); *H01L 29/518* (2013.01); *H01L 29/66545* (2013.01); *H01L 29/66795* (2013.01); *H01L 29/7851* (2013.01); *H01L 29/778* (2013.01)

(58) Field of Classification Search
CPC ......... H01L 21/02389; H01L 21/02458; H01L 21/02603; H01L 21/823431; H01L 21/823821; H01L 21/845; H01L 27/0886; H01L 27/0924; H01L 27/10879; H01L 27/1211; H01L 29/0665; H01L 29/0669; H01L 29/0673; H01L 29/2003; H01L 29/41791; H01L 29/518; H01L 29/66439; H01L 29/66545; H01L 29/66795; H01L 29/775; H01L 29/778; H01L 29/783; H01L 29/7783; H01L 29/785; H01L 29/7851; H01L 29/7853; H01L 29/7855; H01L 29/78681; H01L 2029/7858
See application file for complete search history.

(56) References Cited

U.S. PATENT DOCUMENTS

| | | | |
|---|---|---|---|
| 2013/0279145 A1* | 10/2013 | Then | H01L 29/42392 361/820 |
| 2014/0175515 A1* | 6/2014 | Then | H01L 29/772 257/194 |
| 2018/0175184 A1* | 6/2018 | Then | H01L 29/78 |
| 2018/0261694 A1* | 9/2018 | Dewey | H01L 29/205 |

* cited by examiner

*Primary Examiner* — David C Spalla
(74) *Attorney, Agent, or Firm* — Essential Patents Group, LLP

(57) ABSTRACT

Transistor structures including a fin structure having multiple graded III-N material layers with polarization layers therebetween, integrated circuits including such transistor structures, and methods for forming the transistor structures are discussed. The transistor structures further include a source, a drain, and a gate coupled to the fin structure. The fin structure provides a multi-gate multi-nanowire confined transistor architecture.

20 Claims, 19 Drawing Sheets

TRI-GATE ARCHITECTURE MULTI-NANOWIRE CONFINED TRANSISTOR

BACKGROUND

Power management integrated circuits (PMIC) and radio frequency integrated circuits (RFIC) are critical functional blocks in system on a chip (SoC) implementations. Such SoC implementations may be found in mobile computing platforms such as smartphones, tablets, laptops, netbooks, and the like. In such implementations, the PMIC and RFIC are important factors for power efficiency and form factor (and can be as or more important than logic and memory circuits).

Advanced semiconductor devices may leverage non-silicon semiconductor materials, including III-N materials, as well as other materials with wurtzite crystallinity, which show particular promise for high voltage and high frequency applications like PMICs and RFICs. For example, GaN-based field effect transistor (FET) devices benefit from a relatively wide bandgap (~3.4 eV), enabling higher breakdown voltages than Si-based FETs, as well as high carrier mobility. Such III-N material system devices are also useful for logic circuits, photonics (e.g., LEDs), photovoltaics, and sensors, one or more of which may be useful to integrate into an electronic device platform.

It is desirable to improve the performance of such III-N materials based devices such that, for example, transistors have increased drive current, increased gate control, and reduced leakage at a given dimension. It is with respect to these and other considerations that the present improvements have been needed.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Furthermore, where considered appropriate, reference labels have been repeated among the figures to indicate corresponding or analogous elements. In the figures.

DETAILED DESCRIPTION

Figure 1:
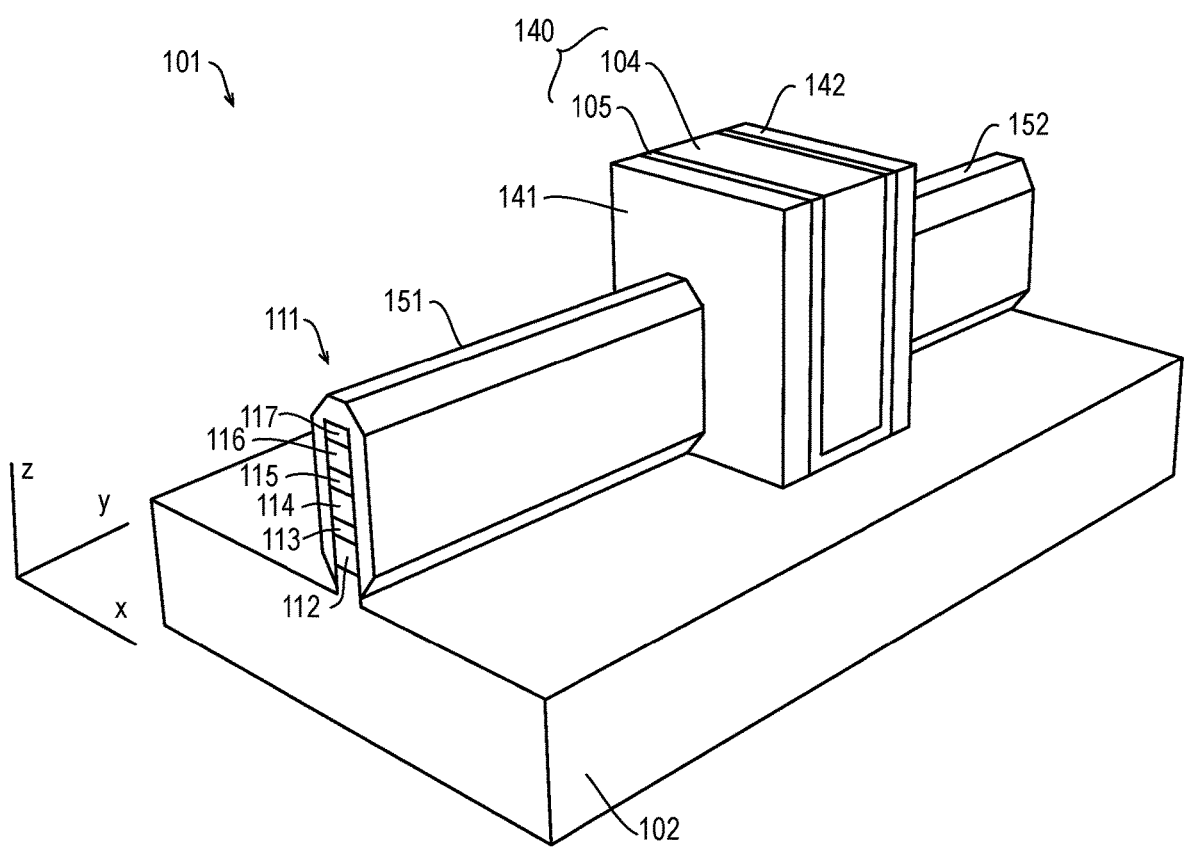
FIG. 1 illustrates an example transistor structure having a fin structure with interleaved graded III-N material and polarization layers.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not specified to be mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. Furthermore, the terms "substantially," "close," "approximately," "near," and "about," generally refer to being within +/−10% of a target value. The term layer as used herein may include a single material or multiple materials.

As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Transistor structures, transistors, devices, apparatuses, computing platforms, and methods are described below related to tri-gate multi-nanowire confined transistors for improved performance.

As described above, it may be advantageous to provide transistor devices with improved performance in terms of increased drive current, increased gate control, and reduced leakage. In some embodiments, a transistor structure includes a fin structure having first and second graded III-N material layers that are separated by a polarization layer therebetween. As used herein, the term "transistor structure" indicates a structure that includes components of a transistor. The first graded III-N material layer and/or the second graded III-N material layer include first and second group III constituents such as indium (In) and gallium (Ga). For example, the first and second group III constituents may be majority lattice constituents of the III-N material. As used herein, the term "III-N material" indicates a material having constituents from group III of the periodic table (e.g., aluminum, gallium, and indium) and nitrogen (N). The first group III constituent has a graded concentration profile with a decreasing concentration thereof along a height of the fin structure. As used herein, the term "graded concentration profile" indicates a concentration of a constituent varies over a particular spatial dimension (e.g., along a height extending away from a substrate along a height of a fin or fin structure).

The fin structure may further include one or more additional graded III-N material layers and polarization layers with the graded III-N material layers and polarization layers being interleaved with one another such that the fin structure has alternating layers of graded III-N material layers and polarization layers. In an embodiment, the graded III-N material layers and polarization layers are crystalline material layers. As used herein, the term "crystalline" indicates a material with a highly ordered structure having a crystal lattice. Such a crystalline material may include low levels of defects such as vacancy, interstitial, or dislocation defects in the range of $10^6$-$10^{11}$/cm$^3$. In an embodiment, three graded III-N material layers and three polarization layers are interleaved. As used herein, the term "polarization layer" indicates a material layer that invokes or provides a carrier gas (e.g., 3D electron gas) in an adjacent graded III-N material layer such that the graded III-N material layer provides a transport layer for a transistor channel. In InGaN graded crystalline III-N material layer systems, for example, the polarization layer may be crystalline AlInGaN.

In some embodiments, the graded III-N material layer includes InGaN and the graded concentration profile has an indium concentration that decreases from a base region (e.g., distal from a polarization layer) thereof to a top region (e.g., proximal to a polarization layer) thereof. As used herein, the term "base region" indicates a portion of a material layer that is proximal to a base of a fin structure, which is, in turn, proximal to a substrate and/or bottom barrier layer. In contrast, a top region of a material layer is distal from the base of the fin structure. In an embodiment, the indium concentration is not less than 15% at the base region and not more than 1% at the top region of the graded III-N material layer. Furthermore, the graded concentration profile may have any suitable concentration distribution extending along the height of the fin structure (e.g., from the base region to the top region). In an embodiment, the graded concentration profile is substantially linear having a substantially constant rate of change along a depth of the fin structure (e.g., from not less than 15% to not more than 1%), which offers the advantages of ease of implementation. In some embodiments, the graded concentration profile has a substantially curved shape with varying rates of change along the depth of the fin structure. For example, the graded concentration profile may have a first concentration per depth rate of change proximal to a top surface of the first graded III-N material layer and a second concentration per depth rate of change proximal to a bottom surface of the first graded III-N material layer. As used herein, the term "surface" indicates either an exposed portion of the material layer or an interface between the material layer and another adjacent material layer. In such latter contexts, the terms surface and material interface may be used interchangeably. The first and second per depth rate of changes are along a depth of the fin structure opposite the direction along the vertical height of the fin structure and the first concentration per depth rate of change is greater than the second concentration per depth rate of change. Such embodiments may offer the advantages of a shallower quantum well proximal to the polarization layer and a deeper quantum well distal from the polarization layer for improved electron gas (e.g., higher carrier density)

and improved transport and drive current in operation. Further embodiments are discussed herein below.

FIG. 1 illustrates an example transistor structure 101 having a fin structure 111 with interleaved graded III-N material and polarization layers, arranged in accordance with at least some implementations of the present disclosure. For example, transistor structure 101 or any other transistor structure discussed herein may be incorporated into a power management integrated circuit, a radio frequency integrated circuit, or logic integrated circuit. As shown, transistor structure 101 includes a fin structure 111 over a barrier layer 102, which is over a substrate (not shown in FIG. 1). Fin structure 111 includes a graded III-N material layer 112, a polarization layer 113, a graded III-N material layer 114, a polarization layer 115, a graded III-N material layer 116, and a polarization layer 117 such that graded III-N material layers 112, 114, 116 are interleaved with polarization layers 113, 115, 117. Transistor structure 101 provides a multi-gate architecture multi-nanowire confined transistor structure. Notably, the channel provided by graded III-N material layers 112, 114, 116 are bound by the tri-gate architecture of fin structure 111 and the confinement of heterostructures provided by polarization layers 113, 115, 117 (e.g., aluminum indium gallium nitride, $Al_xIn_yGa_{1-x-y}N$). Graded III-N material layers 112, 114, 116 and polarization layers 113, 115, 117 may each have a substantially monocrystalline microstructure (e.g., hexagonal Wurtzite). Although monocrystalline, it is noted that crystal quality of such III-N crystalline materials may vary dramatically, for example as a function of the techniques employed to form them and the substrate upon which they are formed. In some exemplary embodiments, defect density within the crystalline graded III-N material layers and polarization layers is in the range of $10^6$-$10^{11}$/cm$^3$.

Figure 3A:
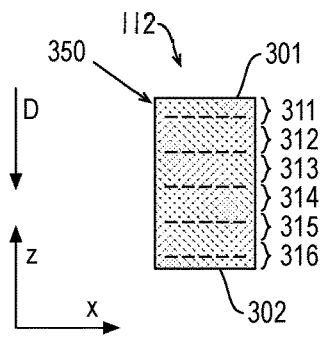
FIG. 3A illustrates a cross-sectional (side) view of an exemplary graded III-N material layer.

The graded concentration profile of graded III-N material layers 112, 114, 116 and the presence of polarization layers 113, 115, 117 induces a carrier gas (e.g., 3D electron gas), which is illustrated herein with respect to graded III-N material layer 112 in FIG. 3A. For example, in FIG. 1A polarization layer 113 induces a carrier gas in graded III-N material layer 112, polarization layer 115 induces a carrier gas in graded III-N material layer 112, and polarization layer 117 induces a carrier gas in graded III-N material layer 112. Transistor structure 101 is illustrated with three graded III-N material layers 112, 114, 116 interleaved with three polarization layers 113, 115, 117 in accordance with some embodiments. However, any number of graded III-N material layers 112, 114, 116 may be interleaved with any number of polarization layers 113, 115, 117. In some embodiments, transistor structure 101 includes four, five, six, or more of each of graded III-N material layers 112, 114, 116 and polarization layers 113, 115, 117. In an embodiment, transistor structure 101 includes two graded III-N material layers 112, 114, 116 interleaved with two polarization layers 113, 115, 117.

Furthermore, the illustrated embodiment of transistor structure 101 includes graded III-N material layer 112 adjacent barrier layer 102, polarization layer 113 on graded III-N material layer 112, graded III-N material layer 112 on polarization layer 113, polarization layer 115 on graded III-N material layer 112, graded III-N material layer 112 on polarization layer 115, and polarization layer 117 on graded III-N material layer 112. Notably, in the illustrated embodiment, polarization layer 117 is distal from barrier layer 102 and graded III-N material layer 112 is proximal to barrier layer 102. However, in some embodiments, the described layers (and graded profiles of graded III-N material layers as discussed herein) may be inverted such that a first polarization layer is proximal to barrier layer 102 and a final graded III-N material layer is distal from barrier layer 102. For example, the layers and characteristics of fin structure 111 may be inverted with respect to barrier layer 102 and/or a substrate below barrier layer 102.

As shown, transistor structure 101 includes graded III-N material layer 112 and graded III-N material layer 112 separated by polarization layer 113 therebetween. As is discussed further herein, graded III-N material layers 112, 114, 116 include first and second group III constituents such that the first group III constituent has a graded concentration profile with a decreasing concentration of the first group III constituent along a vertical height of fin structure 111 such that the vertical height is in the z-direction. That is, the first group III constituent (e.g., indium) has a decreasing concentration from a surface and/or region of graded III-N material layers 112, 114, 116 proximal to barrier layer 102 to a surface and/or region of graded III-N material layers 112, 114, 116 distal from barrier layer 102. Correspondingly, the second group III constituent (e.g., gallium and additional constituents, when implemented) has an increasing concentration from a surface and/or region of graded III-N material layers 112, 114, 116 proximal to barrier layer 102 to a surface and/or region of graded III-N material layers 112, 114, 116 distal from barrier layer 102.

In an embodiment, graded III-N material layers 112, 114, 116 include InGaN material systems with the first group III constituent being indium and the second group III constituent being gallium. In an embodiment, one or more of graded III-N material layers 112, 114, 116 has a concentration of indium of not less than 15% at the surface and/or in the region of graded III-N material layers 112, 114, 116 proximal to barrier layer 102 (e.g., high indium concentration) and a concentration of indium of not more than 1% at the surface and/or in the region of graded III-N material layers 112, 114, 116 distal from barrier layer 102 (e.g., low or zero indium concentration). In an embodiment, the concentration of indium is not more than 3% at the surface and/or in the region of graded III-N material layers 112, 114, 116 distal from barrier layer 102 (e.g., low or zero indium concentration). In an embodiment, the concentration of indium is not more than 5% at the surface and/or in the region of graded III-N material layers 112, 114, 116 distal from barrier layer 102 (e.g., low or zero indium concentration).

The concentration of indium at the surface and/or in the region of graded III-N material layers 112, 114, 116 proximal to barrier layer 102 may be any value greater than the concentration of indium at the surface and/or in the region of graded III-N material layers 112, 114, 116 distal from barrier layer 102. In an embodiment, the concentration of indium at the surface and/or in the region of graded III-N material layers 112, 114, 116 proximal to barrier layer 102 is not less than 20% indium. In an embodiment, the concentration of indium at the surface and/or in the region of graded III-N material layers 112, 114, 116 proximal to barrier layer 102 is not less than 15%. In an embodiment, the concentration of indium at the surface and/or in the region of graded III-N material layers 112, 114, 116 proximal to barrier layer 102 is not less than 10%. In an embodiment, the concentration of indium at the surface and/or in the region of graded III-N material layers 112, 114, 116 distal from barrier layer 102 is not more than 1%. In an embodiment, the concentration of indium at the surface and/or in the region of graded III-N material layers 112, 114, 116 distal from barrier layer 102 is 0% (e.g., the region comprises GaN). In an embodiment, the concentration of indium at the surface and/or in the region of graded III-N material layers 112, 114, 116 distal from barrier layer 102 is not more than 3%. In an embodiment, the concentration of indium at the surface and/or in the region of graded III-N material layers 112, 114, 116 distal from barrier layer 102 is not more than 5%.

For example, the composition of the InGaN material system may be characterized as $In_xGa_{1-x}N$, where x is the concentration of the indium constituent and 1-x is the concentration of the gallium constituent. In the discussed embodiments, the value of x may be not less than 10%, not less than 15%, or not less than 20% at the bottom surface or in the bottom region of graded III-N material layers 112, 114, 116 and the value of x may be not more than 1% or 0% at the top surface or in the top region of graded III-N material layers 112, 114, 116. Such material systems may be characterized as low indium content material systems.

In some embodiments, transistor structures employ high indium content III-N material systems. In such systems, the value of x may be not less than 99% or 100% (e.g., InN) at the bottom surface or in the bottom region of graded III-N material layers 112, 114, 116 and the value of x may be not more than 70%, not more than 60%, or not more than 50% at the top surface or in the top region of graded III-N material layers 112, 114, 116. Such material systems may be characterized as high indium content material systems. Notably, both low and high indium concentration systems decrease indium concentration along the z-direction illustrated in FIG. 1. In an embodiment, one or more of graded III-N material layers 112, 114, 116 has a concentration of indium of not less than 99% at the surface and/or region of graded III-N material layers 112, 114, 116 proximal to barrier layer 102 and a concentration of indium of not more than 70% at the surface and/or region of graded III-N material layers 112, 114, 116 distal from barrier layer 102. In an embodiment, one or more of graded III-N material layers 112, 114, 116 has a concentration of indium of not less than 99% at the surface and/or region of graded III-N material layers 112, 114, 116 proximal to barrier layer 102 and a concentration of indium of not more than 60% at the surface and/or region of graded III-N material layers 112, 114, 116 distal from barrier layer 102. In an embodiment, one or more of graded III-N material layers 112, 114, 116 has a concentration of indium of not less than 99% at the surface and/or region of graded III-N material layers 112, 114, 116 proximal to barrier layer 102 and a concentration of indium of not more than 50% at the surface and/or region of graded III-N material layers 112, 114, 116 distal from barrier layer 102.

Graded III-N material layers 112, 114, 116 may all have the same material systems and concentration profiles, or one or more of these layers may have a different composition and/or concentration with respect to one or more other of these layers. For example, one, two or three of graded III-N material layers 112, 114, 116 may implement low indium concentration systems while the others (if any) implement and high indium concentration systems. In an embodiment, one, two or three of graded III-N material layers 112, 114, 116 implement high indium concentration systems while the others (if any) implement and low indium concentration systems. In an embodiment, graded III-N material layers 112, 114 are low indium concentration systems while graded III-N material layers 116 is a high indium concentration systems. Notably, any material system and concentration profile discussed herein may be implemented in each or any of graded III-N material layers 112, 114, 116. Furthermore, graded III-N material layers 112, 114, 116 may have any graded concentration profiles as discussed further herein with respect to FIGS. 3A, 3B, 3C, and 3D.

Polarization layers 113, 115, 117 include any suitable material(s) that induces a carrier gas (e.g., electron gas) in graded III-N material layers 112, 114, 116. In some embodiments, polarization layer 113, 115, 117 includes Al, with one quaternary example being aluminum indium gallium nitride (AlInGaN). Ternary and binary alternatives are also possible. In some such embodiments, there is more Al content in polarization layers 113, 115, 117 than in graded III-N material layers 112, 114, 116. The carrier gas (e.g., electron gas) induced within graded III-N material layers 112, 114, 116 provides a transport layer for a transistor channel of transistor structure 101. In an embodiment, polarization layers 113, 115, 117 include aluminum indium gallium nitride having an aluminum concentration of not less than 70% and an indium concentration of not more than 17%. For example, polarization layers 113, 115, 117 may include $Al_xIn_yGa_{1-x-y}N$ such that x is in the range of 0.7 to 1.0 and y is not more than 0.17.

With continued reference to FIG. 1, transistor structure 101 includes a source 151 and a drain 152 coupled to fin structure 111. Source 151 and drain 152 may include any suitable material such as n-doped InGaN. Transistor structure 101 also includes sidewall spacers 141, 142, and a gate 140 including a gate dielectric 105 and a gate electrode 104 (e.g., a gate metal). Source 151 and drain 152 may also be characterized as source and drain structures, source and drain electrodes, etc. As shown, in some embodiments, gate 140 includes gate dielectric 105 and gate electrode 104. Gate 140 may be characterized as a gate structure, a gate electrode, etc.

FIG. 1 illustrates exemplary transistor structure 101 with a single fin structure 111. However, transistor structure 101 may include any number of fin structures such as two, three (as illustrated further herein), or more. Such fins may be substantially parallel, orthogonal, or have any other layout. Furthermore, the components of transistor structure 101 are illustrated without shading in the view of FIG. 1 for the sake of clarity of presentation. In the following FIGS., such components are illustrated in plan view and in cross-section with shading, again, for the sake of clarity of presentation.

Figure 2A:
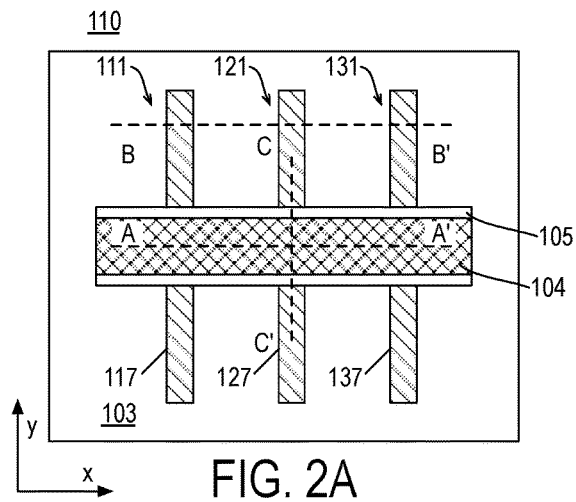
FIG. 2A is a plan view of an example transistor structure.
Figure 2B:
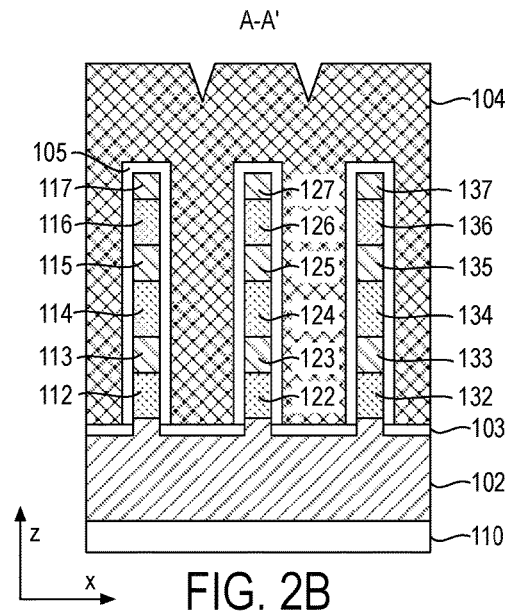
FIG. 2B is a first cross-sectional (side) view of the example transistor structure of FIG. 2A.
Figure 2C:
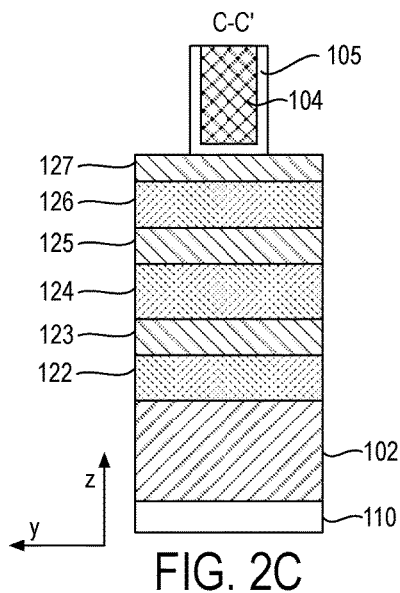
FIG. 2C is a second cross-sectional (side) view of the example transistor structure of FIG. 2A.
Figure 2D:
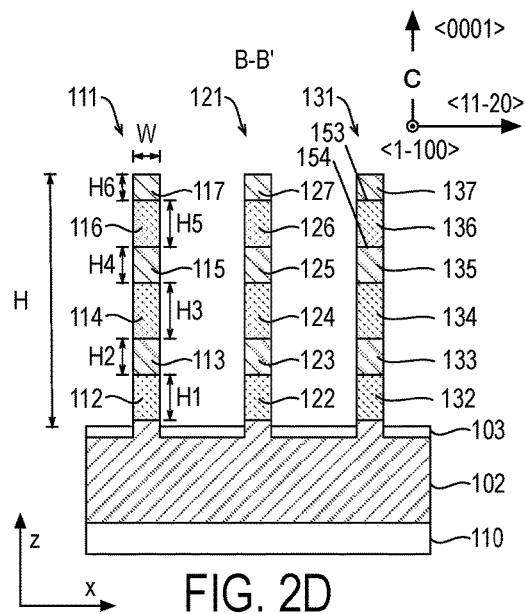
FIG. 2D is a third cross-sectional (side) view of the example transistor structure of FIG. 2A.

FIG. 2A is a plan view of example transistor structure 101, FIG. 2B is a first cross-sectional (side) view of example transistor structure 101, FIG. 2C is a second cross-sectional (side) view of example transistor structure 101, and FIG. 2D is a third cross-sectional (side) view of example transistor structure 101, arranged in accordance with at least some implementations of the present disclosure. For example, FIG. 2B illustrates a cross fin cross-sectional view under the gate taken along plane A-A' viewing in the y-direction, FIG. 2D illustrates a cross fin cross-sectional view outside the gate taken along plane B-B' viewing in the y-direction, and FIG. 2C illustrates an along the fin cross-sectional view under the gate taken along plane C-C' viewing in the x-direction. In the illustrations of FIGS. 2A, 2B, 2C, and 2D, the source, drain, and gate sidewall spacers, as well as other components are not shown for the sake of clarity of presentation.

As shown, transistor structure 101 may include multiple fin structures 111, 121, 131 such that fin structure 111 includes graded III-N material layer 112, polarization layer 113, graded III-N material layer 112, polarization layer 115, graded III-N material layer 112, and polarization layer 117 such that graded III-N material layers 112, 114, 116 are interleaved with polarization layers 113, 115, 117 as discussed with respect to FIG. 1. Fin structure 121 includes graded III-N material layer 112, polarization layer 123, graded III-N material layer 112, polarization layer 125, graded III-N material layer 112, and polarization layer 127 such that graded III-N material layers 122, 124, 126 are interleaved with polarization layers 123, 125, 127. Fin structure 131 includes graded III-N material layer 112, polarization layer 133, graded III-N material layer 112, polarization layer 135, graded III-N material layer 112, and polarization layer 137 such that graded III-N material layers 132, 134, 136 are interleaved with polarization layers 133, 135, 137. Graded III-N material layers 112, 114, 116, 122, 124, 126, 132, 134, 136 and polarization layers 113, 115, 117, 123, 125, 127, 133, 135, 137 may each have a substantially monocrystalline microstructure (e.g., hexagonal Wurtzite). Although monocrystalline, it is noted that crystal quality of such III-N crystalline materials may vary dramatically, for example as a function of the techniques employed to form them and the substrate upon which they are formed. In some exemplary embodiments, defect density within the crystalline graded III-N material layers and polarization layers is in the range of $10^6$-$10^{11}$/cm$^3$.

Furthermore, as shown, transistor structure 101 may include a substrate 110. Substrate 110 may include any suitable material or materials. For example, substrate 110 may be a substrate substantially aligned along a predetermined crystal orientation (e.g., (100), (111), (110), or the like). In some examples, substrate 110 may include a semiconductor material such as monocrystalline silicon (Si), germanium (Ge), silicon germanium (SiGe), a III-V materials based material (e.g., gallium arsenide (GaAs)), a silicon carbide (SiC), a sapphire ($Al_2O_3$), or any combination thereof. In some examples, substrate 110 may include silicon having a (111), (110), or (100) crystal orientation. Substrate 110 may also have 4°-11° of miscut (with 4°-6° being particularly advantageous for (100) oriented embodiments). Examples using silicon having a crystal orientation of (111) or (110) may offer the advantage of having a smaller mismatch for subsequent epitaxial growth. In various examples, substrate 110 may include metallization interconnect layers for integrated circuits or electronic devices such as transistors, memories, capacitors, resistors, optoelectronic devices, switches, or any other active or passive electronic devices separated by an electrically insulating layer, for example, an interlayer dielectric, a trench insulation layer, or the like.

Transistor structure 101 may also include a barrier layer 102, which provides a barrier between substrate 110 and transistor structure 101 as well as a material for the growth of crystalline materials as discussed herein. Barrier layer 102 may be any suitable material or materials, such as, but not limited to, $In_xGa_{1-x}N$ with an indium concentration in the range of 5% to 10% (e.g., x is 0.05 to 0.1). Furthermore, transistor structure 101 may include a shallow trench isolation layer 103, which may include any suitable electrically insulating material such as an oxide.

In an embodiment, corresponding layers of fin structures 111, 121, 131 have substantially the same materials, characteristics, and concentration profiles along the fin height (e.g., z-axis) as those materials are formed in the same processing operations as discussed further herein below. For example, graded III-N material layers 112, 122, 132 may have the same materials, characteristics, and concentration profiles, polarization layer 113, 123, 133 may have the same materials, characteristics and concentration profiles, graded III-N material layers 114, 124, 134 may have the same materials, characteristics, and concentration profiles, polarization layers 115, 125, 135 may have the same materials, characteristics and concentration profiles, graded III-N material layers 116, 126, 136 may have the same materials, characteristics and concentration profiles, and polarization layers 117, 127, 137 may have the same materials, characteristics and concentration profiles. Such layers may also have the same thicknesses and other characteristics discussed herein.

Graded III-N material layers 112, 114, 116, 122, 124, 126, 132, 134, 136 may include any suitable materials or material systems. In an embodiment, graded III-N material layers 112, 114, 116, 122, 124, 126, 132, 134, 136 each have a crystalline structure with a group III-face 153 and a nitrogen face 154 opposite group III-face 153 (illustrated in FIG. 2D only with respect to graded III-N material layer 112 for the sake of clarity of presentation) such that group III-face 153 and nitrogen face 154 are substantially in the x-y plane. The crystals of graded III-N material layers 112, 114, 116, 122, 124, 126, 132, 134, 136 are non-centrosymmetric such that they lack inversion symmetry, and, more particularly, such that group III-face 153 and nitrogen face 154 are not equivalent. For the crystal of graded III-N material layers 112, 114, 116, 122, 124, 126, 132, 134, 136, group III-face 153 is the (0001) crystal plane (e.g., +c polarity or in the <0001> direction such that the +c polarity is in the z-direction) and nitrogen face 154 is the (000-1) crystal plane (e.g., –c polarity, or in the minus <0001> direction such that the –c polarity is in the minus z-direction) as shown in FIG. 2D.

As discussed with respect to FIG. 1, in an embodiment, graded III-N material layers 112, 114, 116, 122, 124, 126, 132, 134, 136 include InGaN material systems with the first group III constituent being indium. In an embodiment, one or more of graded III-N material layers 112, 114, 116, 122, 124, 126, 132, 134, 136 has a concentration of indium of not less than 15% at the surface and/or region of graded III-N material layers 112, 114, 116, 122, 124, 126, 132, 134, 136 proximal to barrier layer 102 and a concentration of indium of not more than 1% at the surface and/or region of graded III-N material layers 112, 114, 116, 122, 124, 126, 132, 134, 136 distal from barrier layer 102. In another embodiment, one or more of graded III-N material layers 112, 114, 116, 122, 124, 126, 132, 134, 136 has a concentration of indium of not less than 99% at the surface and/or region of graded III-N material layers 112, 114, 116, 122, 124, 126, 132, 134, 136 proximal to barrier layer 102 and a concentration of indium of not more than 70% at the surface and/or region of graded III-N material layers 112, 114, 116, 122, 124, 126, 132, 134, 136 distal from barrier layer 102. Also as discussed, polarization layers 113, 115, 117, 123, 125, 127, 133, 135, 137 include any suitable material than induces a carrier gas (e.g., electron gas) such as AlInGaN. The induced carrier gas (e.g., electron gas) in graded III-N material layers 112, 114, 116 provides a transport layer for a transistor channel of transistor structure 101. As discussed, graded III-N material layers 112, 114, 116, 122, 124, 126, 132, 134, 136 may have any suitable group III constituent concentration profiles.

Figure 3B:
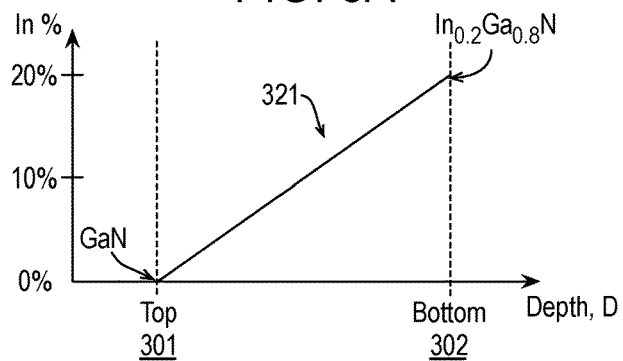
FIG. 3B illustrates a first example graded concentration profile of indium in a graded III-N material layer.
Figure 3C:
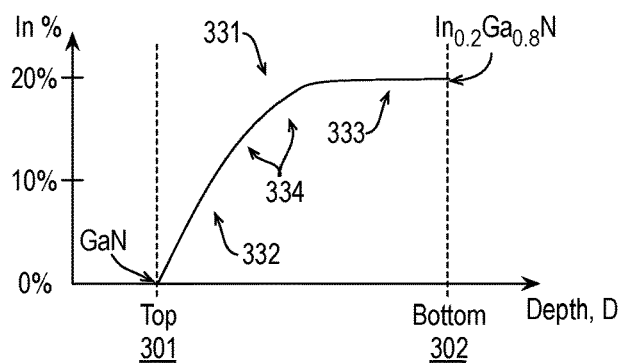
FIG. 3C illustrates a second example graded concentration profile of indium in a graded III-N material layer.
Figure 3D:
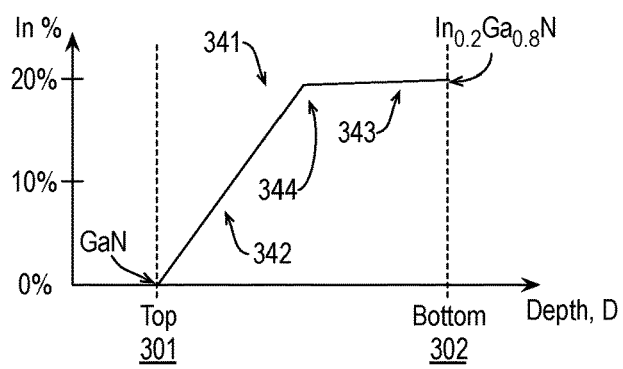
FIG. 3D illustrates a third example graded concentration profile of indium in a graded III-N material layer.

FIG. 3A illustrates a cross-sectional (side) view of exemplary graded III-N material layer 112, FIG. 3B illustrates a first example graded concentration profile of indium in graded III-N material layer 112, FIG. 3C illustrates a second example graded concentration profile of indium in graded III-N material layer 112, and FIG. 3D illustrates a third example graded concentration profile of indium in graded III-N material layer 112, arranged in accordance with at least some implementations of the present disclosure. FIGS. 3A, 3B, 3C, 3D are illustrated with respect to graded III-N material layer 112; however, the characteristics discussed in FIGS. 3A, 3B, 3C, 3D may be implemented via any of graded III-N material layers 112, 114, 116, 122, 124, 126, 132, 134, 136. Notably, graded III-N material layers 112, 114, 116, 122, 124, 126, 132, 134, 136 may have the same such characteristics or they may be different.

As shown in FIG. 3A, a carrier gas 350 (e.g., 3D electron gas) is induced in graded III-N material layer 112 based on the graded III-N material of graded III-N material layer 112 and polarization layer 113 (please refer to FIGS. 2A, 2B, 2C, and 2D). Carrier gas 350 may have any suitable charge density and may be further invoked and/or depleted via operation of gate electrode 104. Notably, carrier gas 350 in graded III-N material layer 112 provides a channel region in fin structure 111 for the operation of transistor structure 101.

Furthermore, graded III-N material layer 112 may include a top surface 301 and a bottom surface 302. Notably, bottom surface 302 is on barrier layer 102 and polarization layer 113 is on top surface 301 (please refer to FIGS. 2A, 2B, 2C, 2D). Furthermore, graded III-N material layer 112 may include regions 311, 312, 313, 314, 315, 316 thereof such that region 311 is a top region of graded III-N material layer 112, region 316 is a bottom region of graded III-N material layer 112 and regions 312, 313, 314, 315 are therebetween. It is noted that graded III-N material layer 112 may include any number of such regions and regions 311, 312, 313, 314, 315, 316 are used to characterize graded III-N material layer 112. As discussed, graded III-N material layer 112 includes increasing indium concentration moving along the depth (D) thereof such that depth (D) is in the opposite direction of the illustrated z-direction. For example, graded III-N material layer 112 includes decreasing indium concentration moving along the z-direction (e.g., the height of the fin structure). Regions 311, 312, 313, 314, 315, 316 may have any suitable heights such as 1 to 5 nm.

The increasing indium concentration moving along the depth (D) of graded III-N material layer 112 may have any suitable graded concentration profile. In an embodiment, the graded concentration profile is a monotonically increasing function along the depth (D) of graded III-N material layer 112. With reference to FIG. 3A, in an embodiment, the indium concentration in region 312 is not less than the indium concentration in region 311, the indium concentration in region 313 is not less than the indium concentration in region 312, the indium concentration in region 314 is not less than the indium concentration in region 313, and so on such that the indium concentration in region 316 is greater than the indium concentration in region 311.

As shown in FIG. 3B, in an embodiment, graded III-N material layer 112 has a graded concentration profile 321 that is substantially linear such that a rate of change of indium concentration is substantially constant from top surface 301 to bottom surface 302. For example, the rate of change of indium concentration (e.g., concentration per depth rate of change, which may be in units of concentration % per nm) in graded concentration profile 321 is substantially the same in each of regions 311, 312, 313, 314, 315, 316. For example, for an indium concentration ranging from 0% to 20% over graded III-N material layer 112 having a height or thickness of 25 nm, the linear rate of change of indium concentration is 0.8%/nm. As discussed, a substantially linear graded concentration profile 321 may offer the advantage of relative ease of production.

In the illustrated embodiments of FIGS. 3B, 3C, and 3D, graded III-N material layer 112 has a GaN/In$_x$Ga$_{1-x}$N material system such that at top surface 301, graded III-N material layer 112 has an indium concentration of zero (e.g., x=0) and top surface 301 (e.g., a thickness at or near top surface 301) is GaN and an indium concentration of 20% (e.g., x=0.2) and bottom surface 302 (e.g., a thickness at or near bottom surface 302) is In$_{0.2}$Ga$_{0.8}$N. However, the indium concentration at or near top surface 301 and bottom surface 302 may be any suitable values such that the indium concentration at or near top surface 301 is less than that at or near bottom surface 302 as discussed herein. In some embodiments, the indium concentration at or near top surface 301 may be in the range of 0% to 1% and the indium concentration at or near bottom surface 302 may be in the range of 15% to 20%. In some embodiments, the indium concentration at or near top surface 301 may be in the range of 50% to 70% and the indium concentration at or near bottom surface 302 may be in the range of 99% to 100%. Furthermore, the indium concentration approaching top surface 301 (e.g., an indium concentration of 0% or other minimum) may be achieved prior to reaching top surface 301. For example, the entirety of region 311 may have an indium concentration of 0% or other minimum indium concentration. Similarly, the indium concentration approaching bottom surface 303 (e.g., an indium concentration of 20% or other maximum) may be achieved prior to reaching bottom surface 303. For example, the entirety of region 316 may have an indium concentration of 20% or other maximum. As used herein with respect to crystalline structures, the term surface indicates a planar surface of transition between first and second materials, although those materials may be part of the same crystalline structure.

As shown in FIG. 3C, in another embodiment, graded III-N material layer 112 has a graded concentration profile 331 that has a substantially curved and concave shape with a greater rate of increase in indium concentration at smaller depths (e.g., closer to top surface 301) than at greater depths (e.g., approaching top surface 302). As shown, graded concentration profile 331 has a concentration per depth rate of change 332 that is proximal to top surface 301 and a concentration per depth rate of change 333 proximal to bottom surface 302 such that both are along and in a direction of depth (D) opposite a direction along the vertical height (z-direction) and such that concentration per depth rate of change 332 is greater than concentration per depth rate of change 333.

Furthermore, in some embodiments, the concentration per depth rate of change from top surface 301 to bottom surface 302 may be continuously decreasing with smaller changes near top surface 301 and bottom surface 302 (e.g., graded concentration profile 331 is closer to linear at such positions) and larger changes at intermediate positions 334 between top surface 301 and bottom surface 302 (e.g., graded concentration profile 331 has a greater curvature at intermediate positions 334). Graded concentration profile 331 offers, for graded III-N material layer 112, the advantages of a shallower quantum well proximal to the polarization layer (e.g., adjacent top surface 301) and a deeper quantum well distal from the polarization layer (e.g., adjacent bottom surface 302) for improved electron gas (e.g., higher carrier density) therein. For example, a shallower quantum well is provided by lower indium concentration (e.g., 0%; GaN) and a rapid increase in indium concentration while a deeper quantum well is provided by increasing to, and maintaining, a high indium concentration along depth D.

With reference to FIG. 3A, graded concentration profile 331 may have larger concentration per depth rates of change for one or more of regions 311, 312, 313 and lesser concentration per depth rates of change for one or more of regions 315, 316.

As shown in FIG. 3D, in another embodiment, graded III-N material layer 112 has a graded concentration profile 341 that has multiple linear portions with differing rates of increase in indium concentration. For example, graded concentration profile 341 has a concentration per depth rate of change 342 that is proximal to top surface 301 and a concentration per depth rate of change 343 proximal to bottom surface 302 such that both are along and in a direction of depth (D) opposite a direction along the vertical height (z-direction) and such that concentration per depth rate of change 342 is greater than concentration per depth rate of change 343. Although illustrated with two linear concentration per depth rates of change segments 342, 343, any number such as three or four may be implemented such that the concentration per depth rate of change (e.g., the slope) decreases with each segment moving along depth D. For example, for three segments, a first segment proximal to top surface 301 has a greater slope than a second segment between top surface 301 and bottom surface 302, which, in turn is greater than a slope of a third segment proximal to bottom surface 302. As shown, between linear concentration per depth rates of change segments 342, 343, an inflection point 344 is provided.

As with graded concentration profile 331, graded concentration profile 341 offers, for graded III-N material layer 112, the advantages of a shallower quantum well proximal to the polarization layer (e.g., adjacent top surface 301) and a deeper quantum well distal from the polarization layer (e.g., adjacent bottom surface 302) for improved electron gas (e.g., higher carrier density) therein. As discussed above, a shallower quantum well is provided by lower indium concentration (e.g., 0%; GaN) and a rapid increase in indium concentration while a deeper quantum well is provided by increasing to and maintaining a high indium concentration along depth D.

Returning to FIGS. 2A, 2B, 2C, 2D, fin structures 111, 121, 131 may have any suitable size and shape. In some exemplary embodiments, fin structures 111, 121, 131 have a height (e.g., in the z-direction), H, to a width (e.g., in the z-direction), W, aspect ratio that is not less than 1:1 with aspect ratios of about 4:1 to 20:1 being advantageous. In some embodiments, fin structures 111, 121, 131 have a width that is not more than 6 nm. In such embodiments, transistor structure 101 may be operated as an enhancement mode device that is in a normally off state when no voltage is applied to gate electrode 104 and such that a positive gate voltage ($V_T$) is applied to gate electrode 104 to switch transistor structure 101 on (e.g., bringing electron charge carriers into the channel regions provided by graded III-N material layers 112, 114, 116, 122, 124, 126, 132, 134, 136). In other embodiments, fin structures 111, 121, 131 have a width that is greater than 6 nm. In such embodiments, transistor structure 101 may be operated as a depletion mode device that is in a normally on state when no voltage is applied to gate electrode 104 and such that a negative gate voltage ($V_T$) is applied to gate electrode 104 to switch transistor structure 101 on (e.g., depleting electron charge carriers from the channel regions provided by graded III-N material layers 112, 114, 116, 122, 124, 126, 132, 134, 136).

Graded III-N material layers 112, 114, 116, 122, 124, 126, 132, 134, 136 may have any suitable heights (or thicknesses) along z-axis, as illustrated with respect to heights H1, H3, H5 such as heights in the range of 5 nm to 30 nm. As used herein, in reference to a material layer, the terms height and thickness are used interchangeably and may be characterized as maximum heights or thicknesses, minimum heights or thicknesses, average heights or thicknesses, or median maximum heights or thicknesses. In an embodiment, each of graded III-N material layers 112, 114, 116, 122, 124, 126, 132, 134, 136 have a height of not less than 5 nm and not more than 30 nm. Furthermore, height H1 of graded III-N material layers 112, 122, 132, height H2 of graded III-N material layers 114, 124, 134, and height H3 of graded III-N material layers 116, 126, 136 may be substantially the same or they may be different. In an embodiment, height H1 is greater than height H2 and height H2 is greater than height H3. In an embodiment, height H1 is in the range of 20-30 nm, height H2 is in the range of 10-20 nm, and height H3 is in the range of 5-10 nm.

Polarization layers 113, 115, 117, 123, 125, 127, 133, 135, 137 may also have any suitable heights along z-axis, as illustrated with respect to heights H2, H4, H6 such as heights in the range of 1 nm to 4 nm. In an embodiment, each of polarization layers 113, 115, 117, 123, 125, 127, 133, 135, 137 have a height of not less than 4 nm and not more than 1 nm. Notably, the heights of polarization layers 113, 115, 117, 123, 125, 127, 133, 135, 137 may be reduced to a minimum height that invokes a carrier gas in their respective graded III-N material layers but does not exceed that height such that as much fin height of fin structures 111, 121, 131 as possible is used for the graded III-N material layers and corresponding transport channel for improved drive current. Also, as discussed, polarization layers 113, 115, 117, 123, 125, 127, 133, 135, 137 may include any suitable material or materials than induce a carrier gas (e.g., electron gas) in their corresponding graded III-N material layers, such as AlInGaN. In an embodiment, polarization layers 113, 115, 117, 123, 125, 127, 133, 135, 137 include aluminum indium gallium nitride having an aluminum concentration of not less than 70% and an indium concentration of not more than 17%. For example, polarization layers 113, 115, 117 may include $Al_xIn_yGa_{1-x-y}N$ such that x is in the range of 0.7 to 1.0 and y is not more than 0.17. Polarization layers 113, 115, 117, 123, 125, 127, 133, 135, 137 may have the same materials or they may be different.

Figure 4:
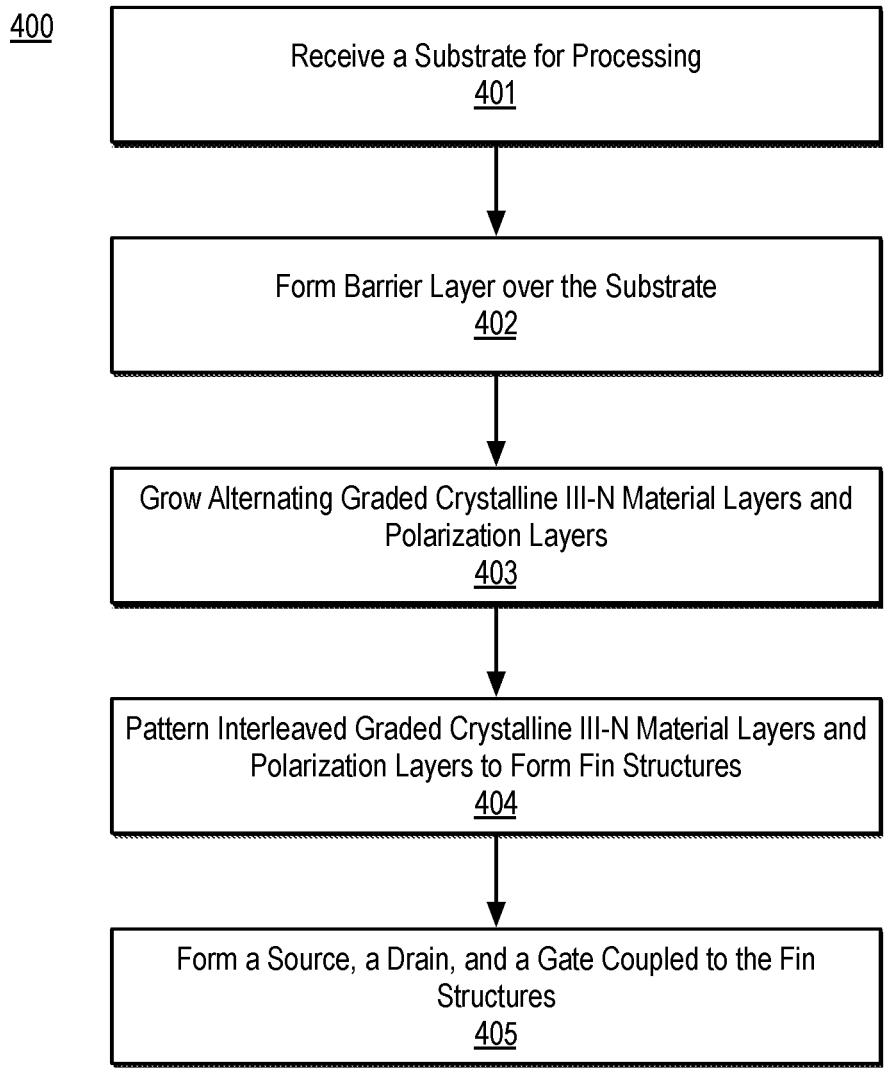
FIG. 4 is a flow diagram illustrating an exemplary process for forming transistor structures having a fin structure with interleaved graded III-N material and polarization layers.
Figure 5A:
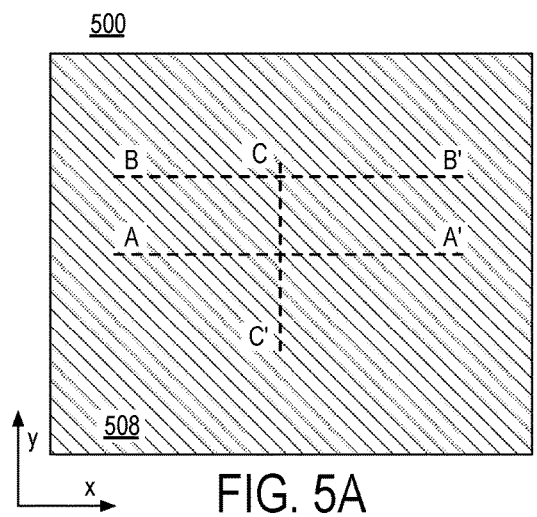
FIGS. 5A, 6A, 7A, 8A, 9A, 10A, 11A, 12A, 13A, 14A, 15A, 16A, and 17A are plan views of example transistor structures as particular fabrication operations are performed.
Figure 5B:
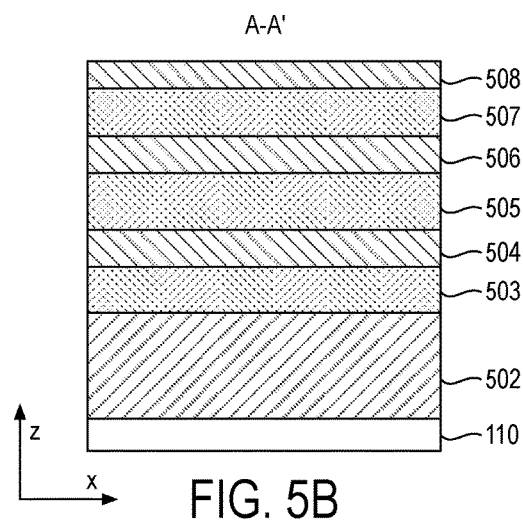
FIGS. 5B, 6B, 7B, 8B, 9B, 10B, 11B, 12B, 13B, 14B, 15B, 16B, and 17B are first cross-sectional (side) views of the example transistor structures as particular fabrication operations are performed.
Figure 5C:
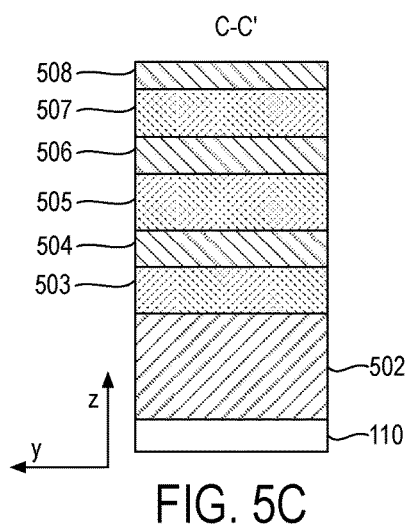
FIGS. 5C, 6C, 7C, 8C, 9C, 10C, 11C, 12C, 13C, 14C, 15C, 16C, and 17C are second cross-sectional (side) views of the example transistor structures as particular fabrication operations are performed.
Figure 5D:
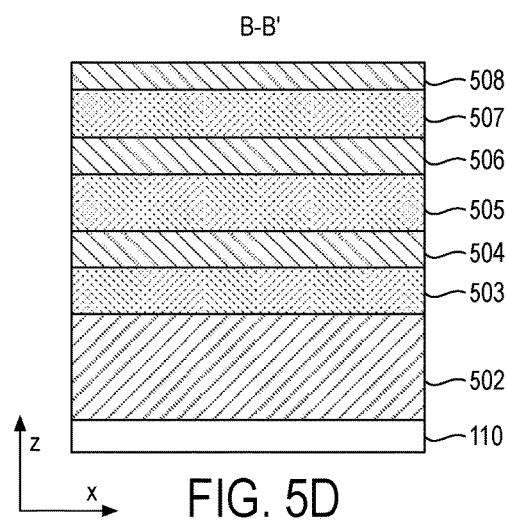
FIGS. 5D, 6D, 7D, 8D, 9D, 10D, 11D, 12D, 13D, 14D, 15D, 16D, and 17D are third cross-sectional (side) views of the example transistor structures as particular fabrication operations are performed.
Figure 6A:
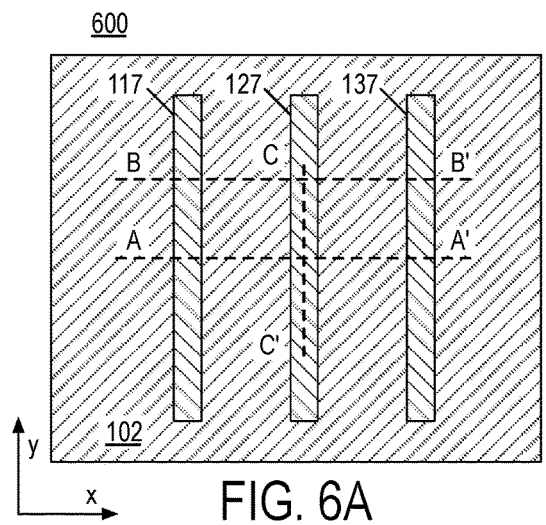
Figure 6B:
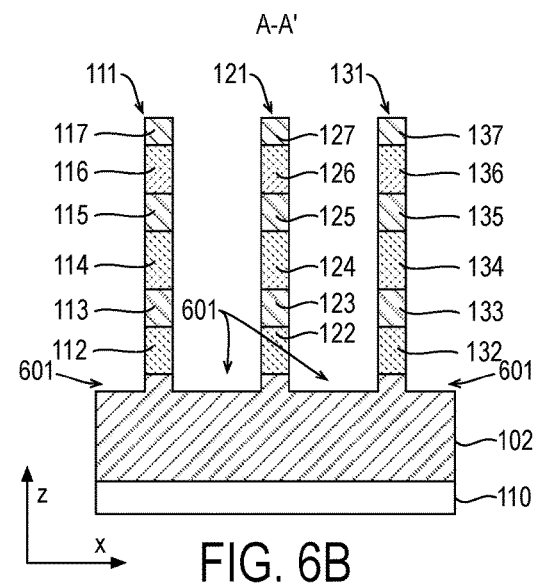
Figure 6C:
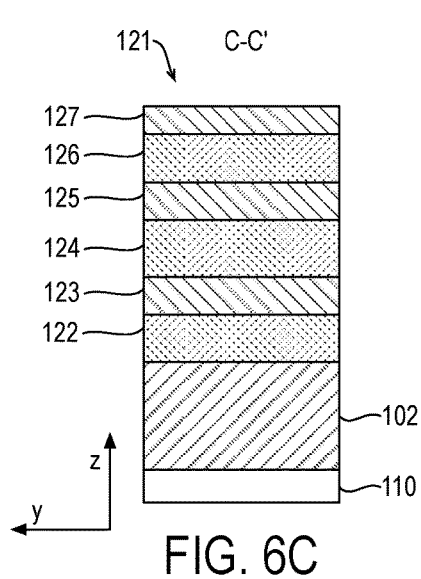
Figure 6D:
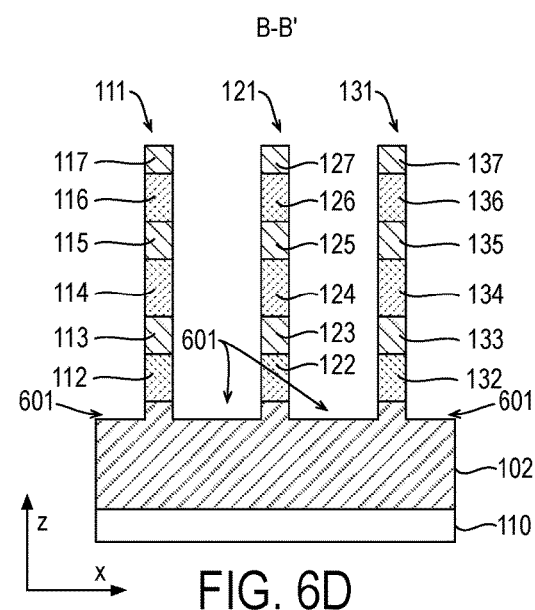
Figure 7A:
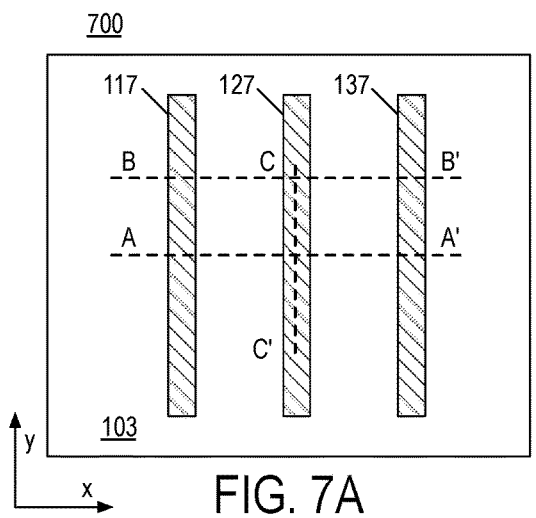
Figure 7B:
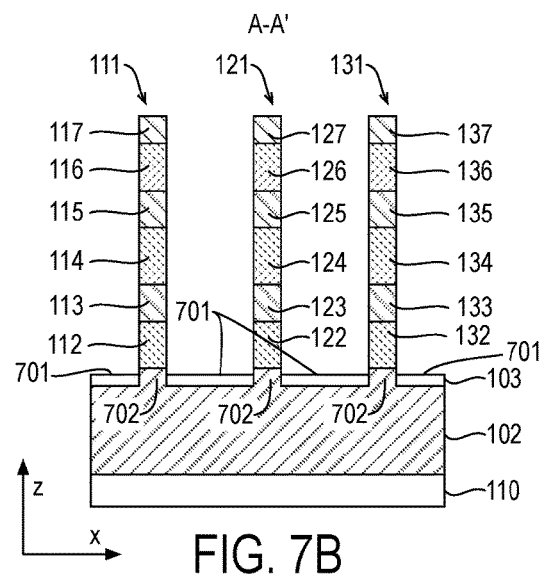
Figure 7C:
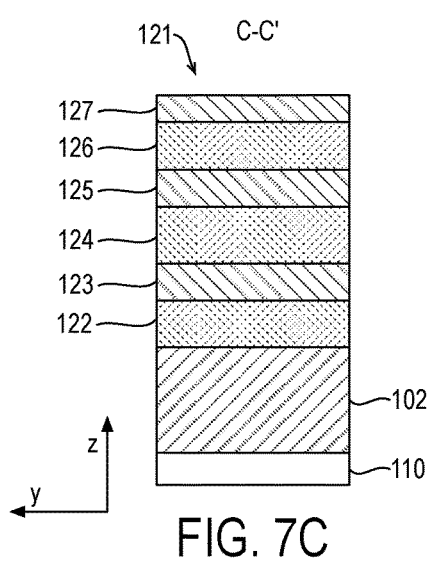
Figure 7D:
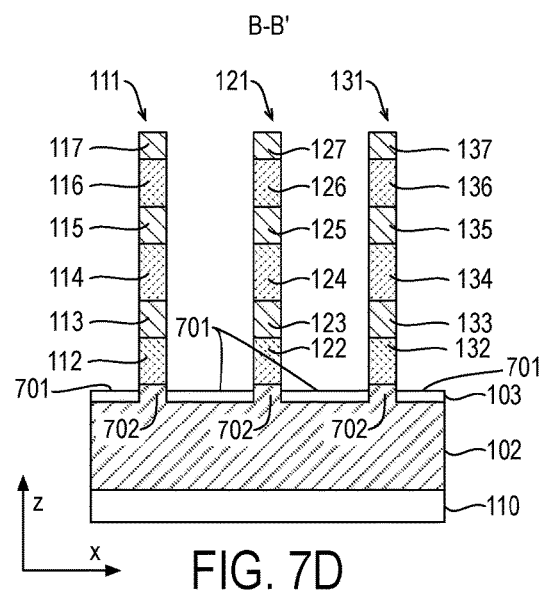
Figure 8A:
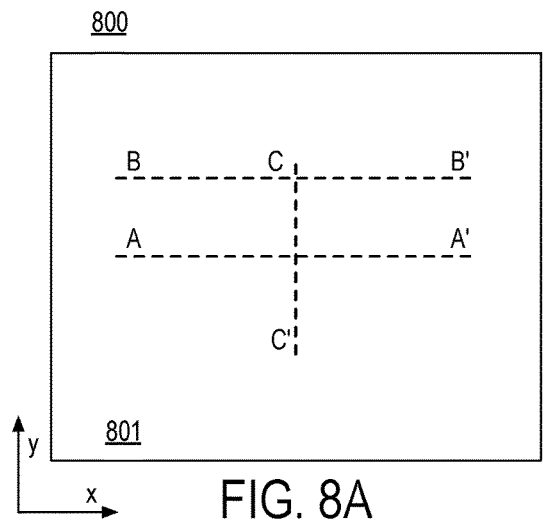
Figure 8B:
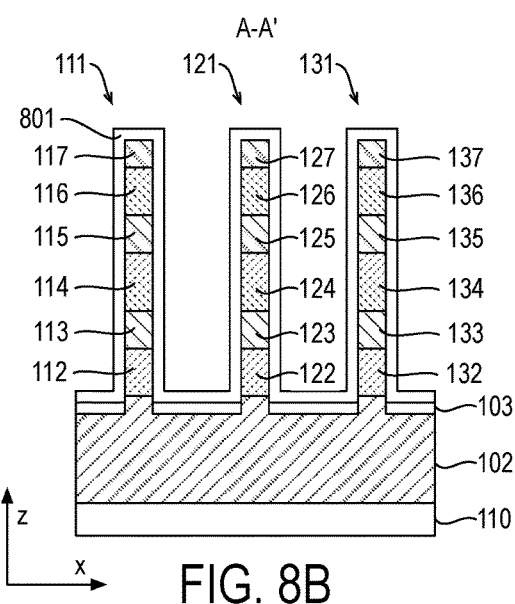
Figure 8C:
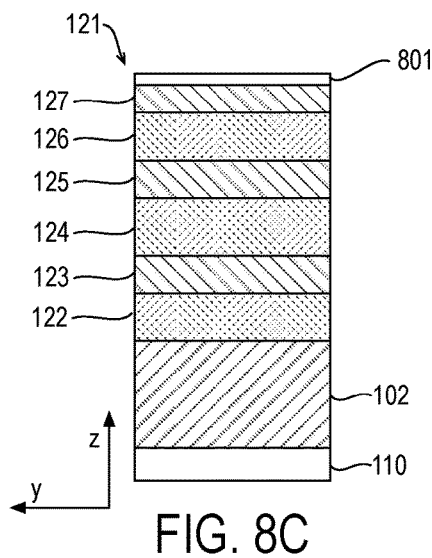
Figure 8D:
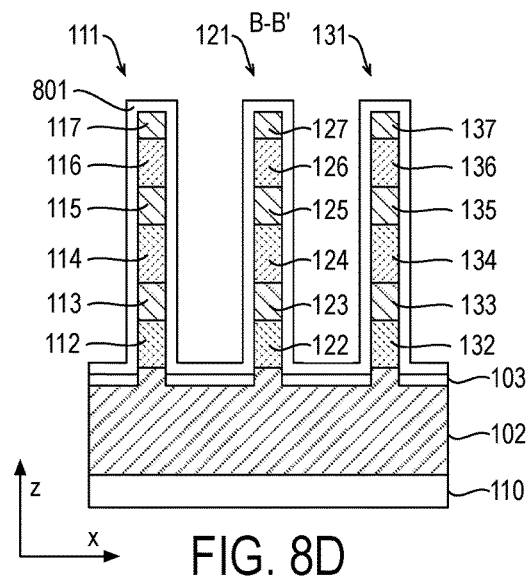
Figure 9A:
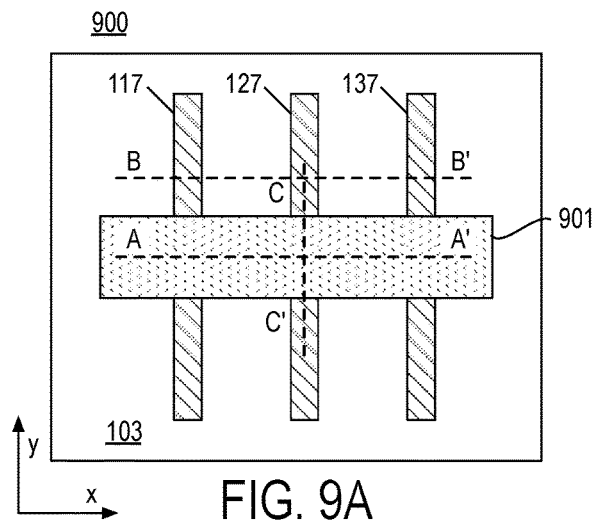
Figure 9B:
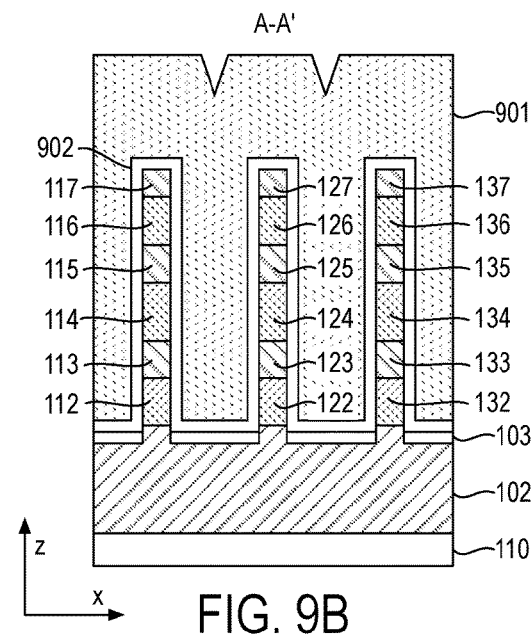
Figure 9C:
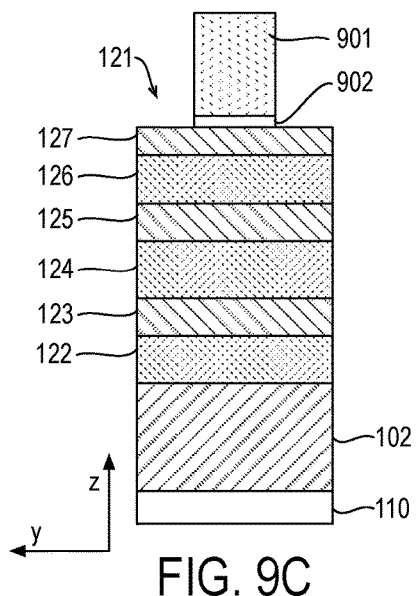
Figure 9D:
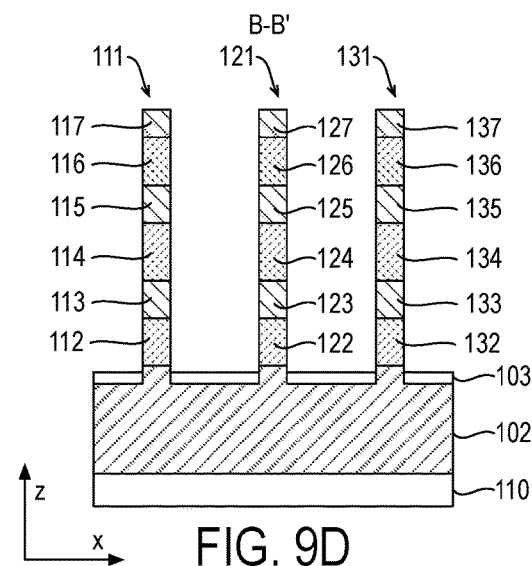
Figure 10A:
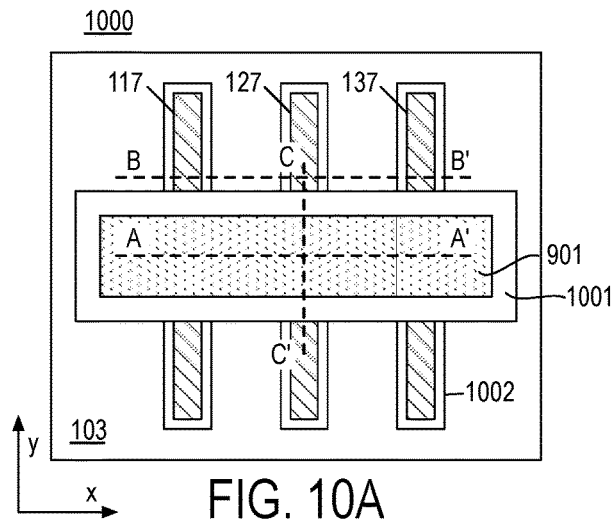
Figure 10B:
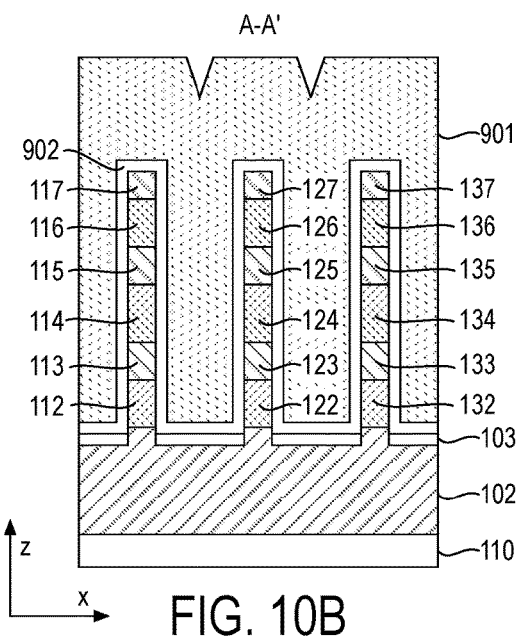
Figure 10C:
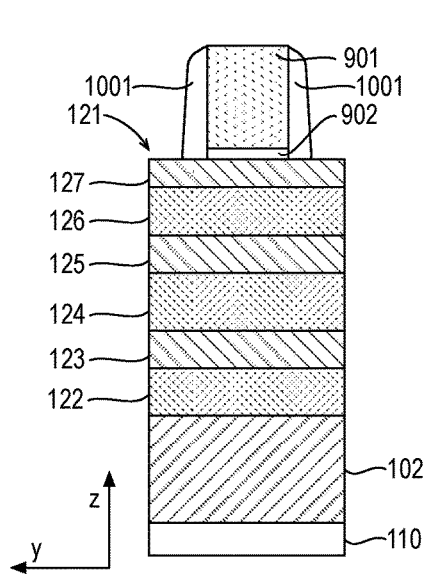
Figure 10D:
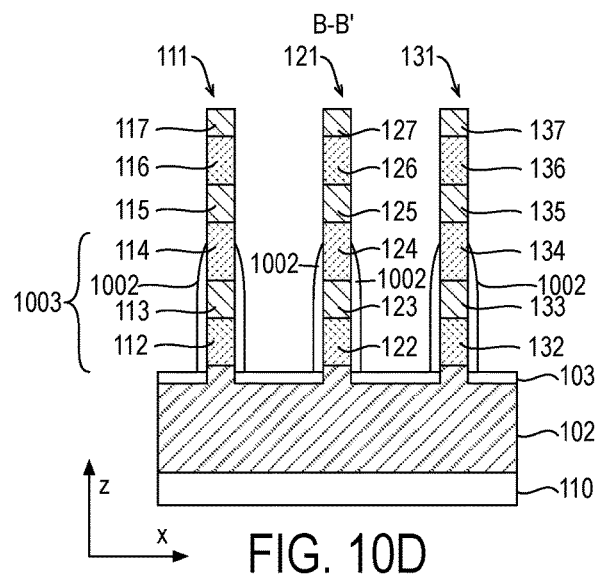
Figure 11A:
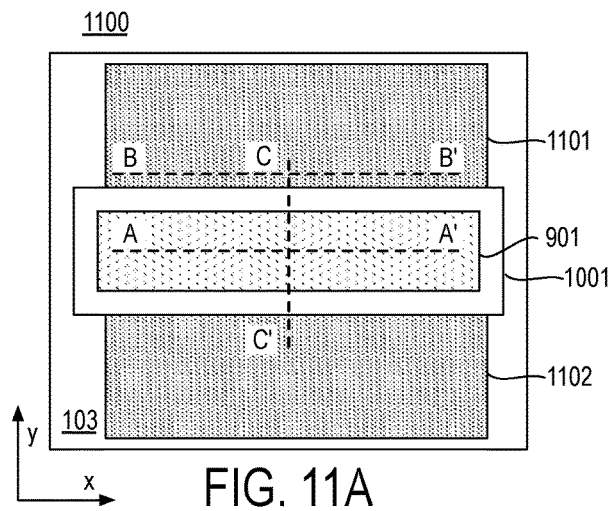
Figure 11B:
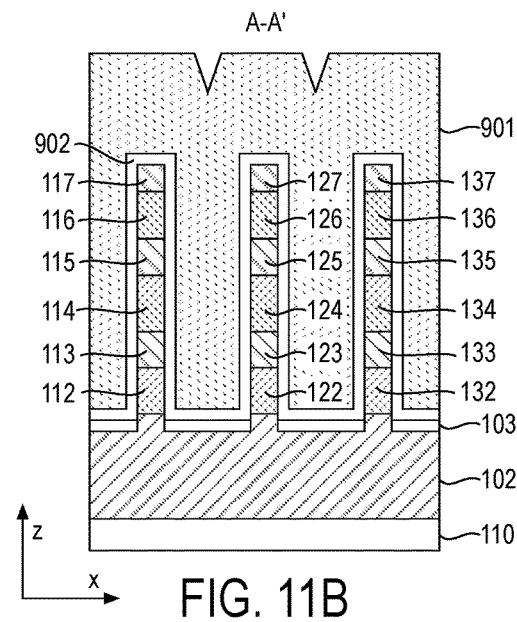
Figure 11C:
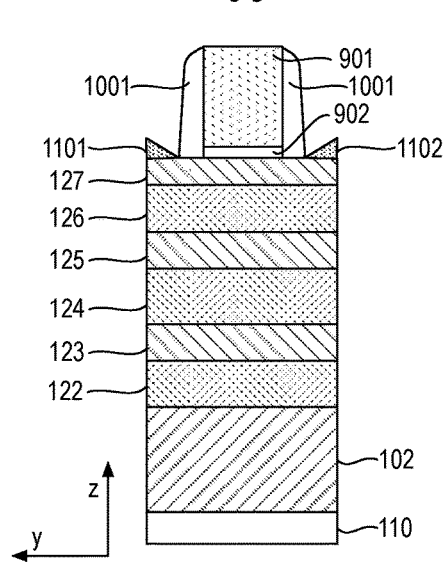
Figure 11D:
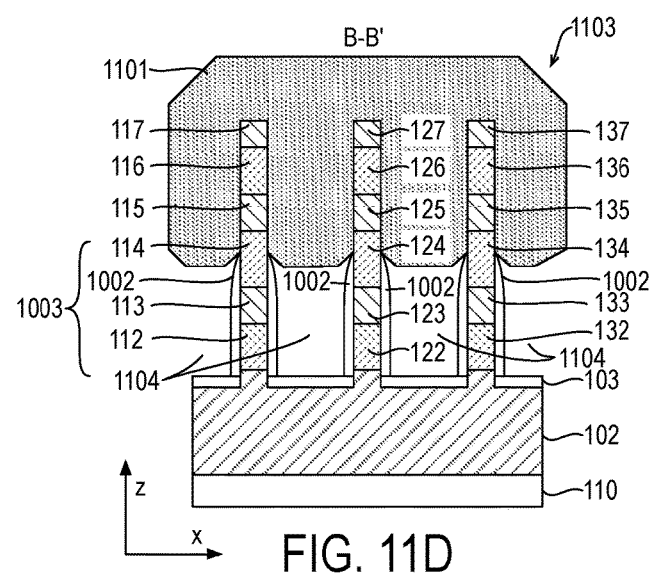
Figure 12A:
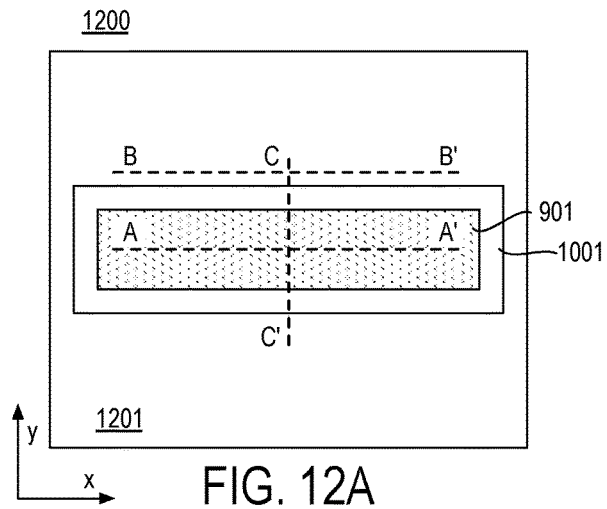
Figure 12B:
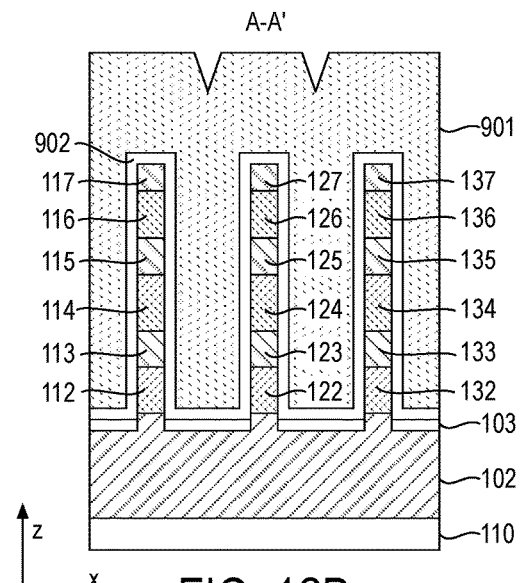
Figure 12C:
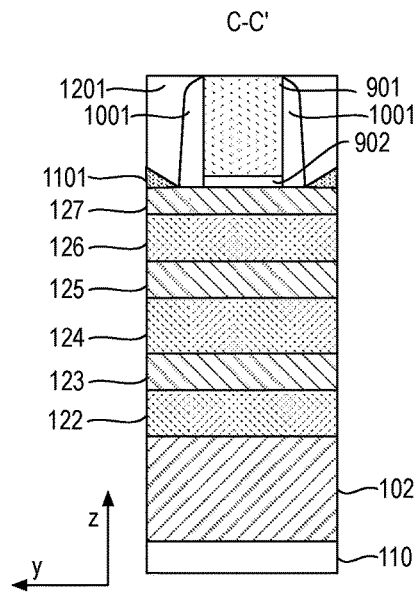
Figure 12D:
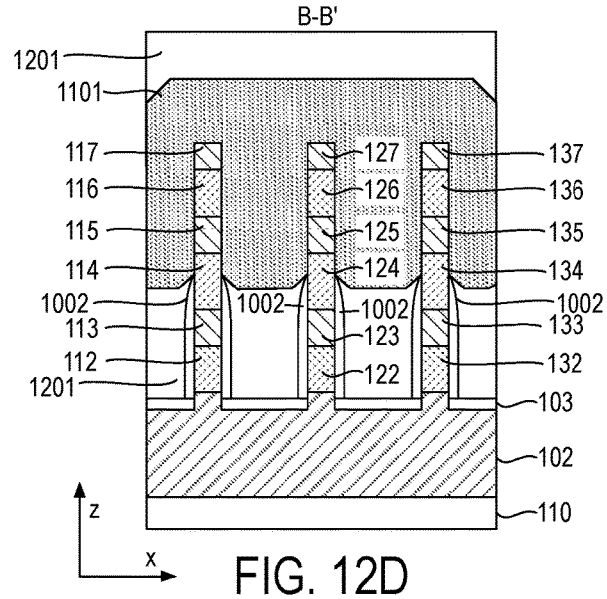
Figure 13A:
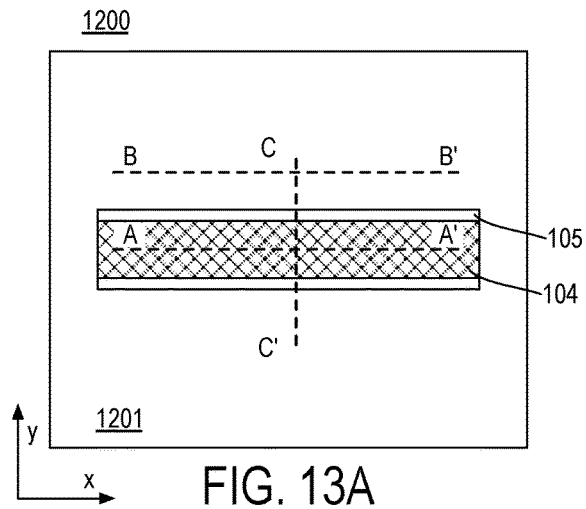
Figure 13B:
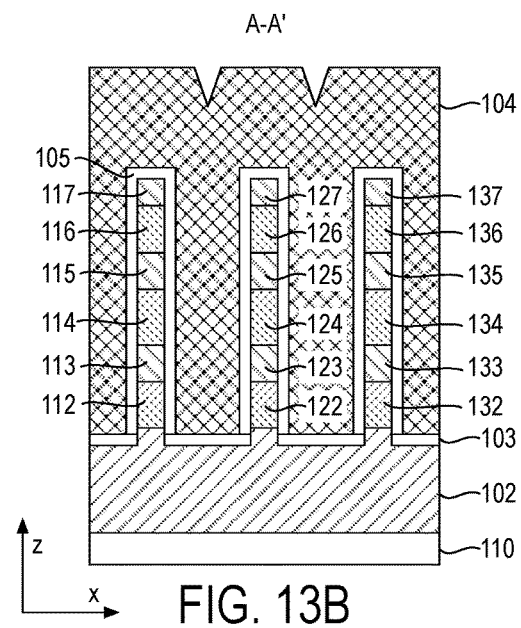
Figure 13C:
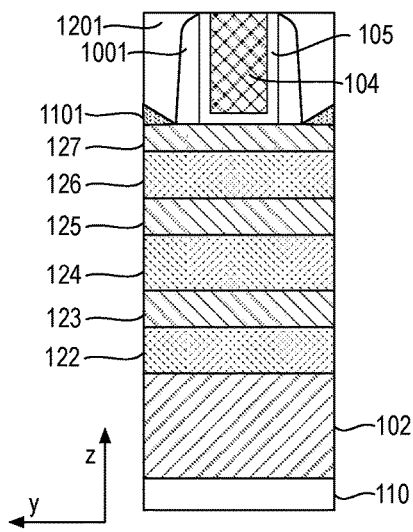
Figure 13D:
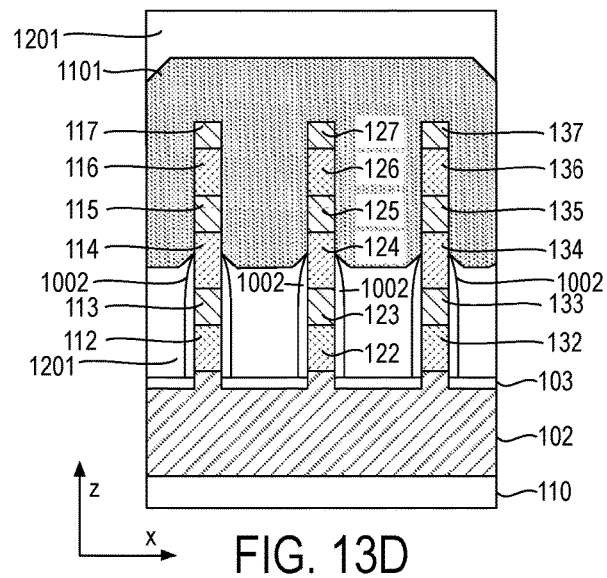
Figure 14A:
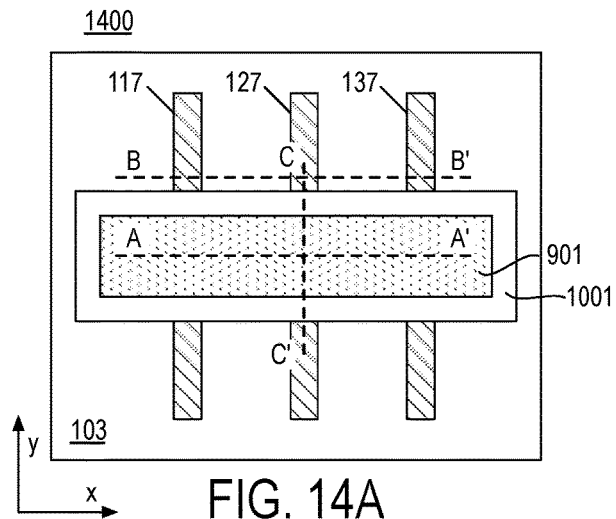
Figure 14B:
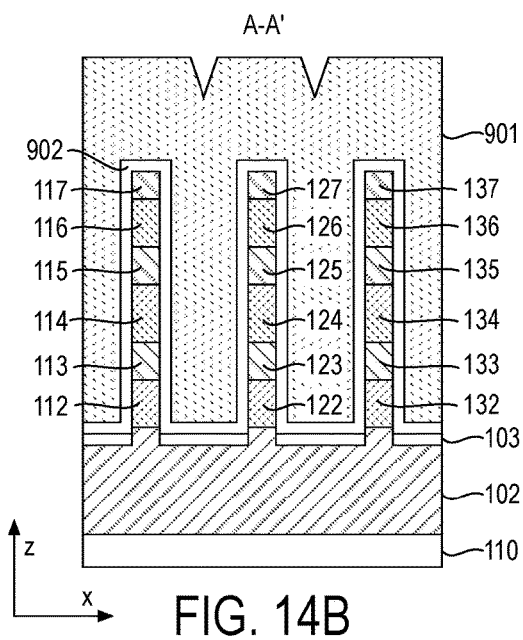
Figure 14C:
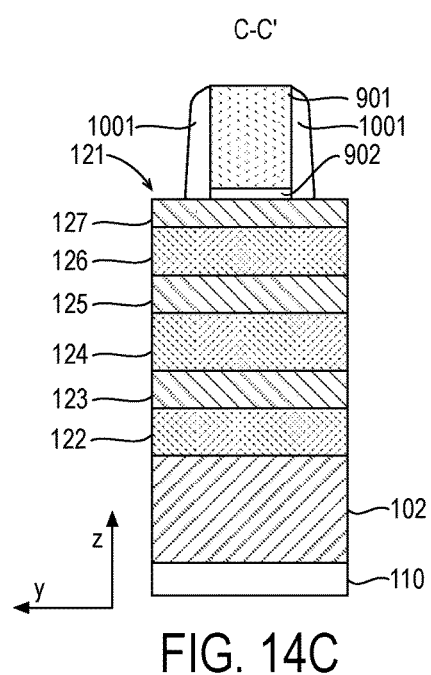
Figure 14D:
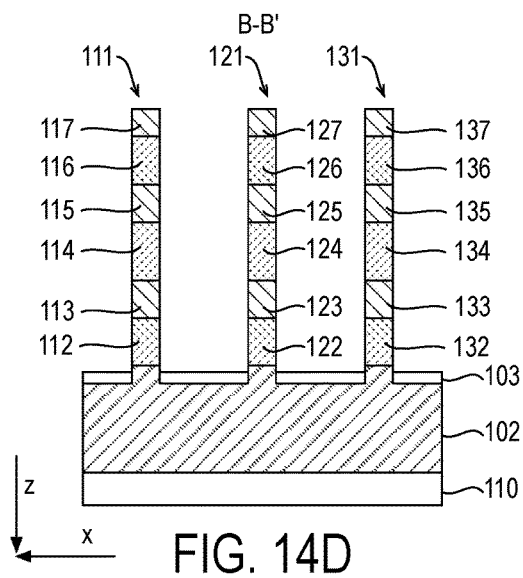
Figure 15A:
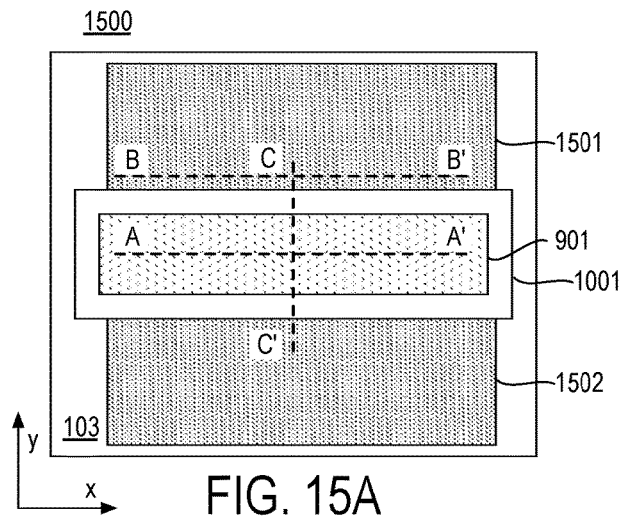
Figure 15B:
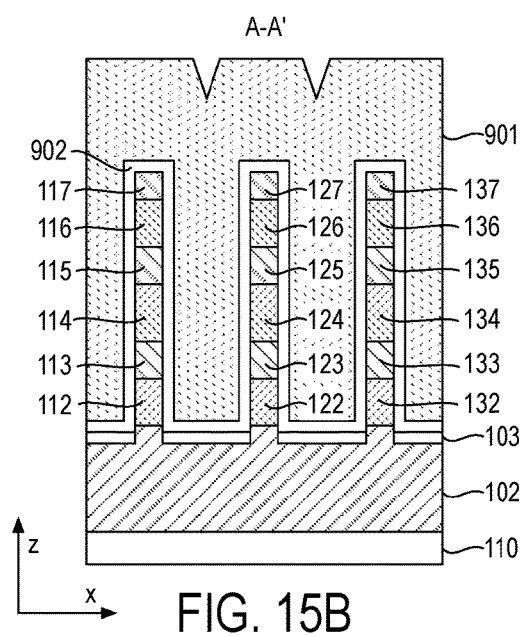
Figure 15C:
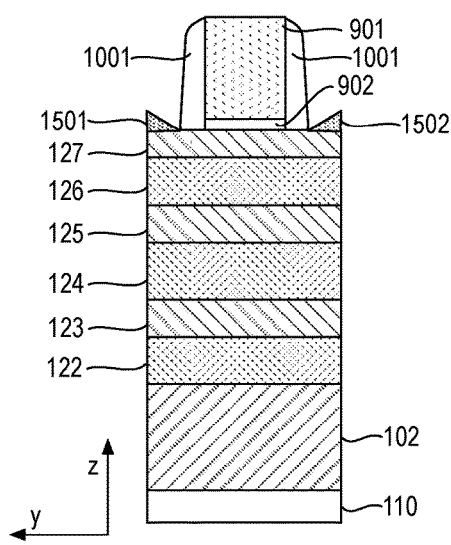
Figure 15D:
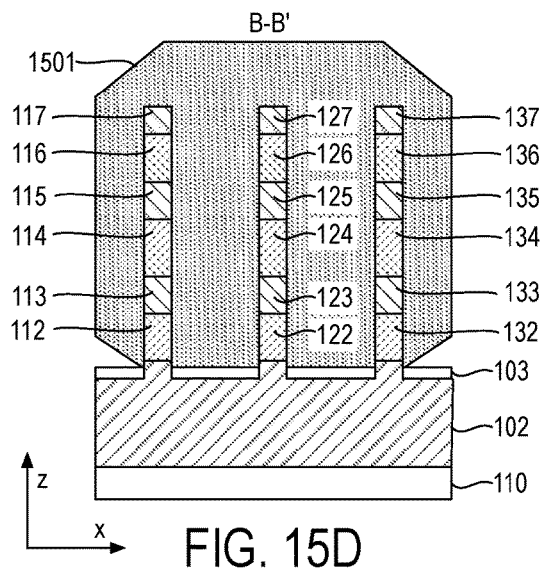
Figure 16A:
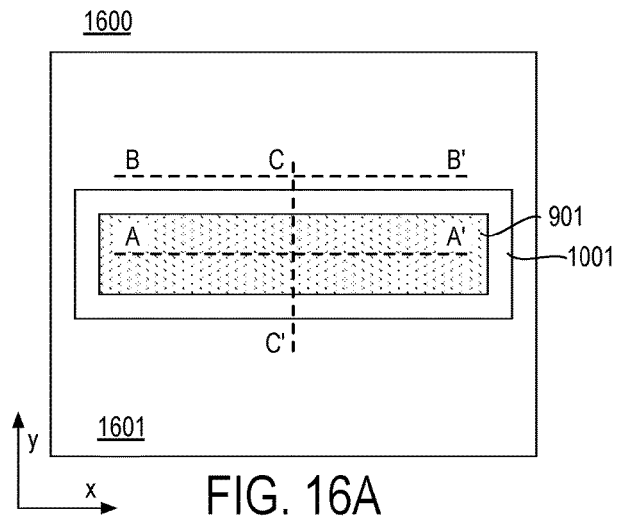
Figure 16B:
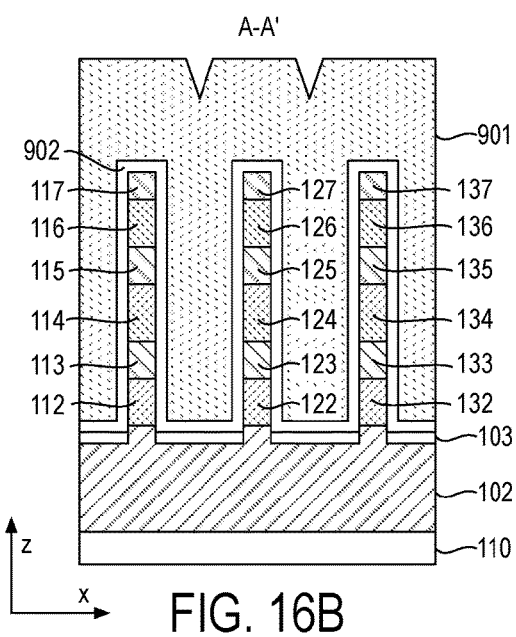
Figure 16C:
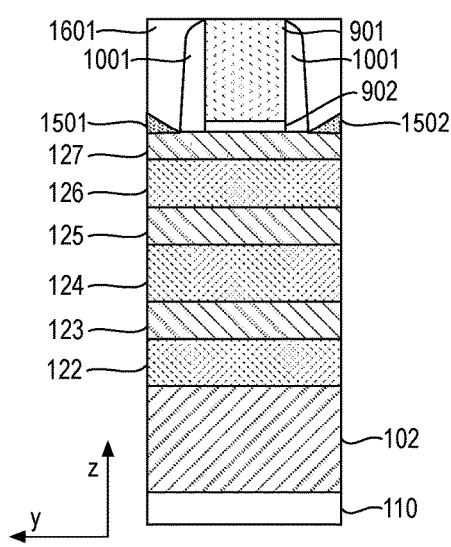
Figure 16D:
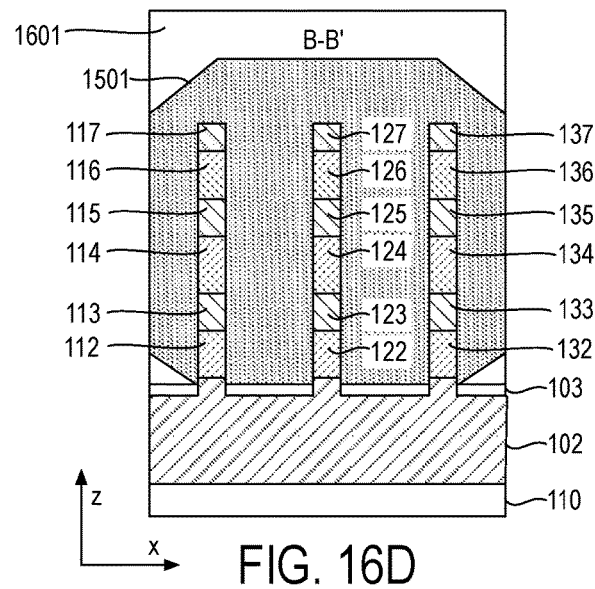
Figure 17A:
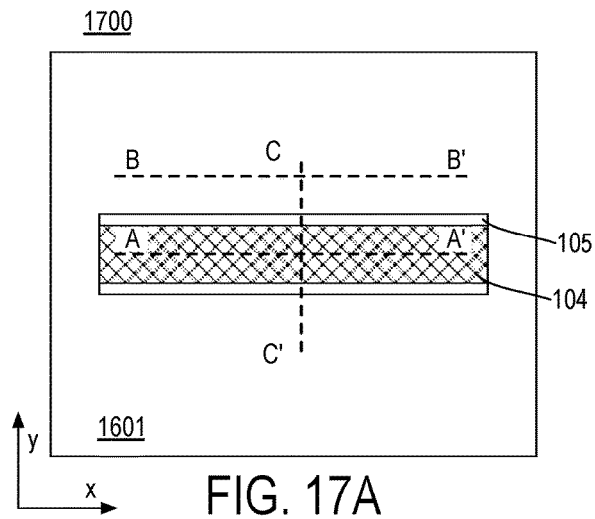
Figure 17B:
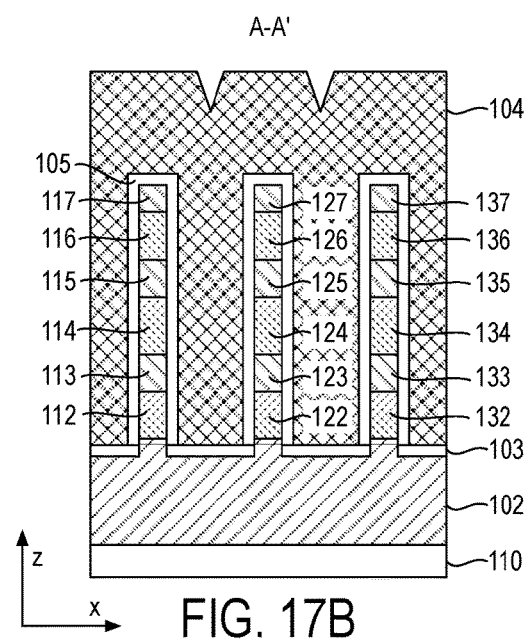
Figure 17C:
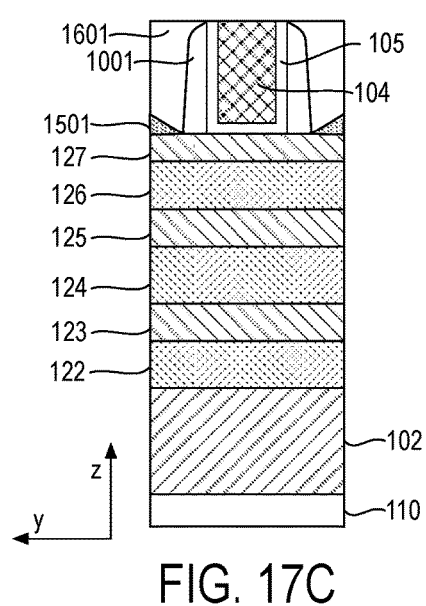
Figure 17D:
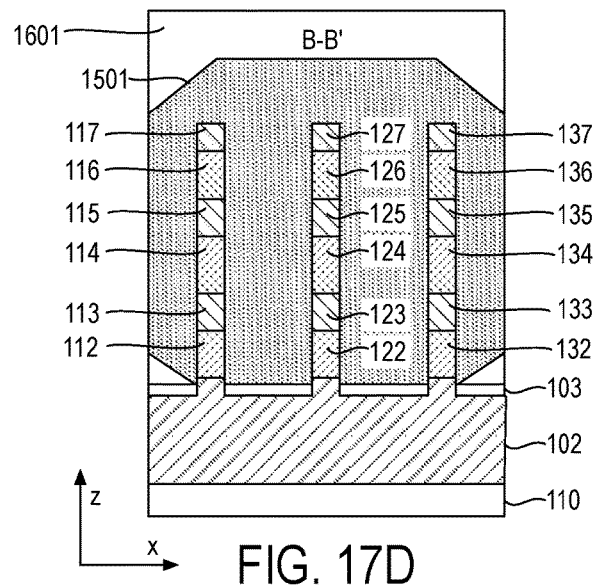

FIG. 4 is a flow diagram illustrating an exemplary process 400 for forming transistor structures having a fin structure with interleaved graded III-N material and polarization layers, arranged in accordance with at least some implementations of the present disclosure. For example, process 400 may be implemented to fabricate transistor structure 101 or any transistor structure discussed herein. In the illustrated implementation, process 400 may include one or more operations as illustrated by operations 401-405. However, embodiments herein may include additional operations, certain operations being omitted, or operations being performed out of the order provided.

Process 400 begins at operation 401, where a substrate is received for processing. The substrate may include any suitable substrate as discussed herein such as a silicon wafer or the like. In some embodiments, the substrate includes underlying devices or electrical interconnects. In some embodiments, substrate 110 may be received and processed as discussed with respect to FIGS. 5-17.

Process 400 continues at operation 402, where a barrier layer is formed over the substrate. The barrier layer may be formed using any suitable technique or techniques and may include any suitable materials such as $Al_xGa_{1-x}N$ with x in the range of 0.05 to 0.1 as discussed herein. In an embodiment, one or more openings are formed in a dielectric layer (e.g., alumina ($Al_2O_3$), silica (SiO), silicon nitrides (SiN), silicon oxynitrides (SiON), or silicon carbonitrides (SiCN)) to expose a surface of the substrate received at operation 401 within the opening(s). The dielectric layer and the openings therein may be formed using any suitable technique or techniques such as deposition and lithography/etch patterning techniques. After the formation of a dielectric layer having openings therein, III-N crystal structures are epitaxially grown from the exposed substrate surfaces within the opening(s) to provide barrier layer 102. The III-N crystal structures may be epitaxially grown using any suitable technique or techniques. For example, the III-N crystals or crystal structures may be epitaxially grown from crystalline seeding surfaces unprotected by the dielectric layer (or a seed layer (e.g., AlN) deposited therein). The growth may laterally overgrow the dielectric to provide a III-N crystal material, which may be optionally planarized to provide barrier layer 102.

Process 400 continues at operation 403, where alternating layers of graded III-N material layers and polarization layers are formed over the barrier layer. The first layer of graded III-N material may be characterized as a first graded III-N material layer, which is followed by a first polarization layer, which is followed by a second graded III-N material layer, and so on. The alternating layers of graded III-N material layers and polarization layers may be formed using any suitable technique or techniques such as epitaxial growth as discussed further herein. In some embodiments, alternating layers of graded III-N material layers and polarization layers are formed as discussed with respect to FIGS. 5A, 5B, 5C, and 5D.

Process 400 continues at operation 404, where the interleaved layers of graded III-N material layers and polarization layers formed at operation 403 are patterned to form fin structures such as fin structures 111, 121, 131 as discussed herein. The interleaved layers of graded III-N material layers and polarization layers may be patterned using any suitable technique or techniques such as patterning and etch techniques. Any number of fin structures may be patterned at operation 404. In some embodiments, the fin structures are patterned as discussed with respect to FIGS. 6A, 6B, 6C, and 6D.

Process 400 continues at operation 405, where a source, a drain, and a gate coupled to the one or more fin structures are formed. The source, drain, and gate may include any suitable material or materials. For example, the gate may include a gate dielectric including aluminum oxide, hafnium oxide, zirconium oxide, titanium silicon oxide, hafnium silicon oxide, or silicon nitride and a gate electrode including a work function layer of platinum, nickel, titanium nitride, or tantalum nitride and a tungsten gate cap metal. The source and drain may include an n-doped group III-N semiconductor material such as n-doped InGaN as discussed herein. The source, drain, and gate may be formed using any suitable technique or techniques. In some embodiments, the source, drain, and gate are formed as discussed with respect to FIGS. 9-13. In some embodiments, the source, drain, and gate are formed as discussed with respect to FIGS. 9,10, and 14-17.

As discussed, process 400 may be implanted to fabricate transistor structure 101 or any other transistor structure discussed herein. Further details associated with such fabrication techniques are discussed herein and in particular, with respect to FIGS. 9-17. Any one or more of the operations of process 400 (or the operations discussed herein with respect to FIGS. 9-17) may be undertaken in response to instructions provided by one or more computer program products. Such program products may include signal bearing media providing instructions that, when executed by, for example, a processor, may provide the functionality described herein. The computer program products may be provided in any form of computer readable medium. Thus, for example, a processor including one or more processor core(s) may undertake one or more of the described operations in response to instructions conveyed to the processor by a computer readable medium.

FIGS. 5A, 6A, 7A, 8A, 9A, 10A, 11A, 12A, 13A, 14A, 15A, 16A, and 17A are plan views of example transistor structures as particular fabrication operations are performed, FIGS. 5B, 6B, 7B, 8B, 9B, 10B, 11B, 12B, 13B, 14B, 15B, 16B, and 17B are first cross-sectional (side) views of the example transistor structures as particular fabrication operations are performed, FIGS. 5C, 6C, 7C, 8C, 9C, 10C, 11C, 12C, 13C, 14C, 15C, 16C, and 17C are second cross-sectional (side) views of the example transistor structures as particular fabrication operations are performed, and FIGS. 5D, 6D, 7D, 8D, 9D, 10D, 11D, 12D, 13D, 14D, 15D, 16D, and 17D are third cross-sectional (side) views of the example transistor structures as particular fabrication operations are performed. For example, FIGS. 5B, 6B, 7B, 8B, 9B, 10B, 11B, 12B, 13B, 14B, 15B, 16B, and 17B are cross fin cross-sectional views under the gate taken along plane A-A' viewing in the y-direction as the particular fabrication operations are performed, FIGS. 5C, 6C, 7C, 8C, 9C, 10C, 11C, 12C, 13C, 14C, 15C, 16C, and 17C are along the fin cross-sectional views under the gate taken along plane C-C' viewing in the x-direction as the particular fabrication operations are performed, and FIGS. 5D, 6D, 7D, 8D, 9D, 10D, 11D, 12D, 13D, 14D, 15D, 16D, and 17D are cross fin cross-sectional views outside the gate taken along plane B-B' viewing in the y-direction as the particular fabrication operations are performed.

As shown in FIGS. 9A, 9B, 9C, and 9D, a transistor structure 900 includes a substrate 110 received for processing as discussed with respect to operation 401. Substrate 110 may be any substrate discussed herein such as a substrate substantially aligned along a predetermined crystal orientation, a semiconductor material such as monocrystalline silicon (Si), germanium (Ge), silicon germanium (SiGe), a III-V materials based material (e.g., gallium arsenide (GaAs)), a silicon carbide (SiC), a sapphire ($Al_2O_3$), or any combination thereof.

As shown, barrier layer 502 is formed on or over substrate 110 as discussed with respect to operation 402. Barrier layer 502 may be formed using any suitable technique or techniques and may include any suitable material or materials such as such as $In_xGa_{1-x}N$ with an indium concentration in the range of 5% to 10% (e.g., x is 0.05 to 0.1). Furthermore, alternating layers of graded III-N material layers 503, 505, 507 and polarization layers 504, 506, 508 are formed over the barrier layer. Graded III-N material layers 503, 505, 507 may be characterized as first, second, and third graded III-N material layers 503, 505, 507, bulk graded III-N material layers 503, 505, 507, etc. Similarly, polarization layers 504, 506, 508 may be characterized as first, second, and third polarization layers 504, 506, 508, bulk polarization layers 504, 506, 508, etc.

Alternating layers of graded III-N material layers 503, 505, 507 and polarization layers 504, 506, 508 may be formed using any suitable epitaxial growth technique such as, for example, an epitaxial growth via chemical vapor deposition (CVD), metal organic chemical vapor deposition (MOCVD), atomic layer deposition (ALD), molecular beam epitaxy (MBE), or any other epitaxial growth technique, with MOCVD and MBE being particularly advantageous. Alternating layers of graded III-N material layers 503, 505, 507 and polarization layers 504, 506, 508 may include any suitable III-N materials discussed herein.

In an embodiment, graded III-N material layers 503, 505, 507 may include graded GaN/In$_x$Ga$_{1-x}$N as discussed herein that ranges from an indium concentration of 0.2 (e.g., x=0.2) or 0.15 (e.g., x=0.15) to an indium concentration of 0.0 (e.g., x=0.0; GaN) along the z-direction. For example, graded III-N material layer 503 may have a profile of In$_x$Ga$_{1-x}$N that is In$_{0.15-0.2}$Ga$_{0.85-0.8}$N adjacent to barrier layer 502 and GaN adjacent to polarization layer 504, graded III-N material layer 505 may have a profile of In$_x$Ga$_{1-x}$N that is In$_{0.15-0.2}$Ga$_{0.85-0.8}$N adjacent to polarization layer 504 and GaN adjacent to polarization layer 506, and graded III-N material layer 507 may have a profile of In$_x$Ga$_{1-x}$N that is In$_{0.15-0.2}$Ga$_{0.85-0.8}$N adjacent to polarization layer 506 and GaN adjacent to polarization layer 508. Furthermore, the constituent (e.g., indium) concentration may vary across the heights (or thicknesses) of graded III-N material layers 503, 505, 507 according to any concentration profile discussed herein.

In an embodiment, graded III-N material layers 503, 505, 507 may include graded GaN/In$_x$Ga$_{1-x}$N as discussed herein that ranges from an indium concentration of 1.0 (e.g., x=1.0; InN) or 0.99 (e.g., x=0.9) to an indium concentration in the range of 0.5 (e.g., x=0.5) to 0.7 (e.g., x=0.7) along the z-direction. For example, graded III-N material layer 503 may have a profile of In$_x$Ga$_{1-x}$N that is InN adjacent to barrier layer 502 and In$_{0.5-0.7}$Ga$_{0.7-0.3}$N adjacent to polarization layer 504, graded III-N material layer 505 may have a profile of In$_x$Ga$_{1-x}$N that is InN adjacent to polarization layer 504 and In$_{0.5-0.7}$Ga$_{0.7-0.3}$N adjacent to polarization layer 506, and graded III-N material layer 507 may have a profile of In$_x$Ga$_{1-x}$N that is InN adjacent to polarization layer 506 and In$_{0.5-0.7}$Ga$_{0.7-0.3}$N adjacent to polarization layer 508. In such material system contexts, the constituent (e.g., indium) concentration may vary across the heights (or thicknesses) of graded III-N material layers 503, 505, 507 according to any concentration profile discussed herein.

Polarization layers 504, 506, 508 include any suitable material than induces a carrier gas (e.g., electron gas) in graded III-N material layers 503, 505, 507 such as AlInGaN. In an embodiment, polarization layers 504, 506, 508 include aluminum indium gallium nitride having an aluminum concentration of not less than 70% and an indium concentration of not more than 17%. For example, polarization layers 113, 115, 117 may include Al$_x$In$_y$Ga$_{1-x-y}$N such that x is in the range of 0.7 to 1.0 and y is not more than 0.17.

FIGS. 6A, 6B, 6C, and 6D illustrate a transistor structure 600 similar to transistor structure 500, after the patterning of interleaved layers of graded III-N material layers 503, 505, 507 and polarization layers 504, 506, 508 to form fin structures 111, 121, 131. Interleaved layers of graded III-N material layers 503, 505, 507 and polarization layers 504, 506, 508 may be patterned using any suitable technique or techniques such as lithography and etch techniques. As shown, in some embodiments, patterning interleaved layers of graded III-N material layers 503, 505, 507 and polarization layers 504, 506, 508 may include an over etch of barrier layer 502 to provide recesses 601 in barrier layer 102.

FIGS. 7A, 7B, 7C, and 7D illustrate a transistor structure 700 similar to transistor structure 600, after the formation of a shallow trench isolation layer 103. Shallow trench isolation layer 103 may be formed using any suitable technique or techniques. In an embodiment, shallow trench isolation layer 103 is formed by providing a bulk oxide over fin structures 111, 121, 131, planarizing the bulk oxide over fin structures 111, 121, 131, and etching the planarized bulk oxide to form shallow trench isolation layer 103. Notably, the planarization operation may provide substantially planar shallow trench isolation layer 103. Shallow trench isolation layer 103 may include any suitable electrically insulating material(s) such as silicon oxide. As shown, in some embodiments, a top surface 701 of shallow trench isolation layer 103 is below portions 702 of barrier layer 102. In other embodiments, top surface 701 of shallow trench isolation layer 103 may be above portions 702 and adjacent portions of graded III-N material layers 112, 122, 132.

FIGS. 8A, 8B, 8C, and 8D illustrate a transistor structure 800 similar to transistor structure 700, after the formation of a conformal oxide layer 801 over fin structures 111, 121, 131 and shallow trench isolation layer 103. Conformal oxide layer 801 may be formed using any suitable technique or techniques such as conformal deposition techniques and conformal oxide layer 801 may include any suitable materials such as silicon oxide.

FIGS. 9A, 9B, 9C, and 9D illustrate a transistor structure 900 similar to transistor structure 800, after the formation of a dummy gate 901. Dummy gate 901 may be formed using any suitable technique or techniques. In an embodiment, a bulk dummy gate material is formed over conformal oxide layer 801. The bulk dummy gate material is then patterned to form dummy gate 901. In an embodiment, the bulk dummy gate material is planarized prior to patterning. As shown, a portion 902 of conformal oxide layer 801 remains under dummy gate 901.

FIGS. 10A, 10B, 10C, and 10D illustrate a transistor structure 1000 similar to transistor structure 900, after the formation of sidewall structures 1001, 1002. Sidewall structures 1001, 1002 may be formed using any suitable technique or techniques such as conformal deposition techniques followed by a directional etch to remove portions of the conformal material layer while leaving sidewall structures 1001, 1002. Sidewall structures 1001, 1002 may include any suitable material or materials such as SiO$_2$, SiON, SiOCN, SiOC(H), SiN, SOG, BCB, etc. As shown, sidewall structures 1001 are formed adjacent to dummy gate 901 and conformal oxide portion 902. Furthermore, sidewall structures 1002 are formed adjacent to at least base portions 1003 of fin structures 111, 121, 131. For example, base portions 1003 of fin structures 111, 121, 131 extend from barrier layer 102 in the z-direction along graded III-N material layers 112, 122, 132, polarization layers 113, 123, 133, graded III-N material layers 114, 124, 134, polarization layers 115, 125, 135, graded III-N material layers 116, 126, 136, and polarization layers 117, 127, 137. Base portions 1003 may include any such portions of fin structures 111, 121, 131, height or thickness of fin structures 111, 121, 131, etc.

In the illustrated embodiment, sidewall structures 1002 are adjacent to graded III-N material layers 112, 122, 132 (such that sidewalls thereof are covered) and polarization layers 113, 123, 133 (such that sidewalls thereof are covered), and adjacent to portions of graded III-N material layers 114, 124, 134 (such that portions of sidewalls thereof are covered) while polarization layers 115, 125, 135, 117, 127, 137 and graded III-N material layers 116, 126, 136 are exposed. However, sidewall structures 1002 may be adjacent to any portions of sidewalls of fin structures 111, 121, 131 such as the entire sidewalls, up to top surfaces of graded III-N material layers 114, 124, 134, etc. As discussed herein below with respect to FIGS. 14-17, in some embodiments, sidewall structures 1002 are removed prior to further processing.

FIGS. 11A, 11B, 11C, and 11D illustrate a transistor structure 1100 similar to transistor structure 1000, after the formation of source 1101 and drain 1102. Source 1101 and drain 1102 may be formed using any suitable technique or techniques including epitaxial growth techniques such as, for example, an epitaxial growth via CVD, MOCVD, ALD, MBE, etc., with MOCVD and MBE being particularly advantageous. Source 1101 and drain 1102 may include any suitable material or materials such an n-doped InGaN as discussed herein. As shown, the formation of source 1101 and drain 1102 may be seeded from exposed portions of fin structures 111, 121, 131 and source 1101 and drain 1102 may include facets such as facet 1103 due to the directional growth of the crystals of source 1101 and drain 1102. Notably, source 1101 and drain 1102 are absent from regions 1104 adjacent to and between sidewall structures 1002 and fin structures 111, 121, 131 as portions of source 1101 and drain 1102 merge during the formation thereof.

FIGS. 12A, 12B, 12C, and 12D illustrate a transistor structure 1200 similar to transistor structure 1100, after the formation of field insulator 1201. Field insulator 1201 may be formed using any suitable technique or techniques. In an embodiment, a bulk field insulator is formed over and around the exposed structures of transistor structure 1100 (e.g., within regions 1104 and over source 1101, drain 1102, dummy gate 901, and sidewall structures 1001) and the bulk field insulator is planarized to form field insulator 1201, which is adjacent to and between sidewall structures 1001 and adjacent to source 1101 and drain 1102. For example, field insulator 1201 is between sidewall structures 1001 adjacent to fin structures 111, 121 and adjacent to fin structures 121, 131 under source 1101 and under drain 1102. Field insulator 1201 may include any suitable electrically insulating material such as silicon oxide.

FIGS. 13A, 13B, 13C, and 13D illustrate a transistor structure 1300 similar to transistor structure 1200, after the removal of dummy gate 901 and conformal oxide portion 902 and the formation of gate dielectric 105 and gate electrode 104. Dummy gate 901 and conformal oxide portion 902 may be removed using any suitable technique or techniques including selective etch techniques and/or patterning and etch techniques. Subsequent to the removal of dummy gate 901 and conformal oxide portion 902, gate dielectric 105 and gate electrode 104 may be formed using any suitable technique or techniques. In an embodiment, a blanket gate dielectric is formed using conformal deposition techniques, subsequent bulk gate electrode material or materials are formed, and the bulk gate electrode and blanket gate dielectric are planarized to form gate dielectric 105 and gate electrode 104.

Gate dielectric 105 may be characterized as a gate dielectric layer, a dielectric layer or the like and gate dielectric 105 may include any suitable material or material stack of any suitable thickness. In some embodiments, gate dielectric 105 includes a gate dielectric material such as but not limited to aluminum oxide ($Al_2O_3$), hafnium oxide ($HfO_2$), zirconium oxide ($ZrO_2$), titanium silicon oxide (TiSiO), hafnium silicon oxide (HfSiO) or silicon nitride ($Si_3N_4$). In an embodiment, gate dielectric 105 has a thickness in the range of 2-10 nm. In an embodiment, gate dielectric 105 is a composite stack including two separate and distinct layers of gate dielectric materials chosen from the above group of gate dielectric materials. Gate electrode 104 may be any suitable material or materials. In an embodiment, gate electrode 104 includes a work function layer or material such as but not limited to platinum (Pt), nickel (Ni), titanium nitride (TiN), or tantalum nitride (TaN) and a gate cap metal such as tungsten on the work function layer or material.

Notably, electrical contact may be made to gate electrode 104, source 1101, and drain 1102 (e.g., by forming source and drain contact vias in field insulator 1201) for the operation of transistor structure 101. Furthermore, higher level metallization layers including metal routing layers and interleaved via layers may be formed to connect transistor structure 101 to other integrated devices (transistors and/or other electronic devices) to provide a monolithic integrated circuit device, which may, in turn, be incorporated via a circuit board or the like into an electronic device.

FIGS. 14A, 14B, 14C, and 14D illustrate a transistor structure 1400 similar to transistor structure 1000 (please refer to FIGS. 10A, 10B, 10C, and 10D), after the removal of sidewall structures 1002 (while leaving sidewall structures 1001). Sidewall structures 1002 may be removed using any suitable technique or techniques. In an embodiment, sidewall structures 1002 are removed using lithography and etch techniques such that a patterned material (e.g., photoresist) that covers sidewall structures 1001 and dummy gate 901 while exposing sidewall structures 1002 and fin structures 111, 121, 131 is provided. Subsequently, a selective etch is performed to removes sidewall structures 1001 while fin structures 111, 121, 131 remain. The patterned material may then be removed using dry etch techniques for example.

FIGS. 15A, 15B, 15C, and 15D illustrate a transistor structure 1500 similar to transistor structure 1400, after the formation of source 1501 and drain 1502. Source 1501 and drain 1502 may be formed using any suitable technique or techniques including epitaxial growth techniques such as, for example, an epitaxial growth via CVD, MOCVD, ALD, MBE, etc., with MOCVD and MBE being particularly advantageous. Source 1501 and drain 1502 may include any suitable material or materials such an n-doped InGaN. As shown, the formation of source 11501 and drain 1502 may be seeded from exposed portions of fin structures 111, 121, 131 such that the removal of sidewall structures 1002 discussed with respect to FIGS. 14A, 14B, 14C, and 14D may expose the entirety of fin structures 111, 121, 131. Notably, source 1501 and drain 1502 are along the entireties of fin structures 111, 121, 131 and fully fill the space between fin structures 111, 121, 131 as portions of source 1501 and drain 1502 merge during the formation thereof.

FIGS. 16A, 16B, 16C, and 16D illustrate a transistor structure 1600 similar to transistor structure 1500, after the formation of field insulator 1601. Field insulator 1601 may be formed using any suitable technique or techniques. In an embodiment, a bulk field insulator is formed over and around the exposed structures of transistor structure 1500 (e.g., over source 1501, drain 1502, dummy gate 901, and sidewall structures 1001) and the bulk field insulator is planarized to form field insulator 1601. Field insulator 1201 may include any suitable electrically insulating material such as silicon oxide.

FIGS. 17A, 17B, 17C, and 17D illustrate a transistor structure 1700 similar to transistor structure 1600, after the removal of dummy gate 901 and conformal oxide portion 902 and the formation of gate dielectric 105 and gate electrode 104. Dummy gate 901 and conformal oxide portion 902 may be removed using any suitable technique or techniques including selective etch techniques and/or patterning and etch techniques. Subsequent to the removal of dummy gate 901 and conformal oxide portion 902, a blanket gate dielectric may be formed using conformal deposition techniques, subsequent bulk gate electrode material or materials may be formed, and the bulk gate electrode and blanket gate dielectric are planarized to form gate dielectric 105 and gate electrode 104.

As discussed with respect to FIGS. 13A, 13B, 13C, and 13D, electrical contact may be made to gate electrode 104, source 1501, and drain 1502 (e.g., by forming source and drain contact vias in field insulator 1601) for the operation of transistor structure 101. Furthermore, higher level metallization layers including metal routing layers and interleaved via layers may be formed to connect transistor structure 101 to other integrated devices (transistors and/or other electronic devices) to provide a monolithic integrated circuit device, which may, in turn, be incorporated via a circuit board or the like into an electronic device.

Figure 18:
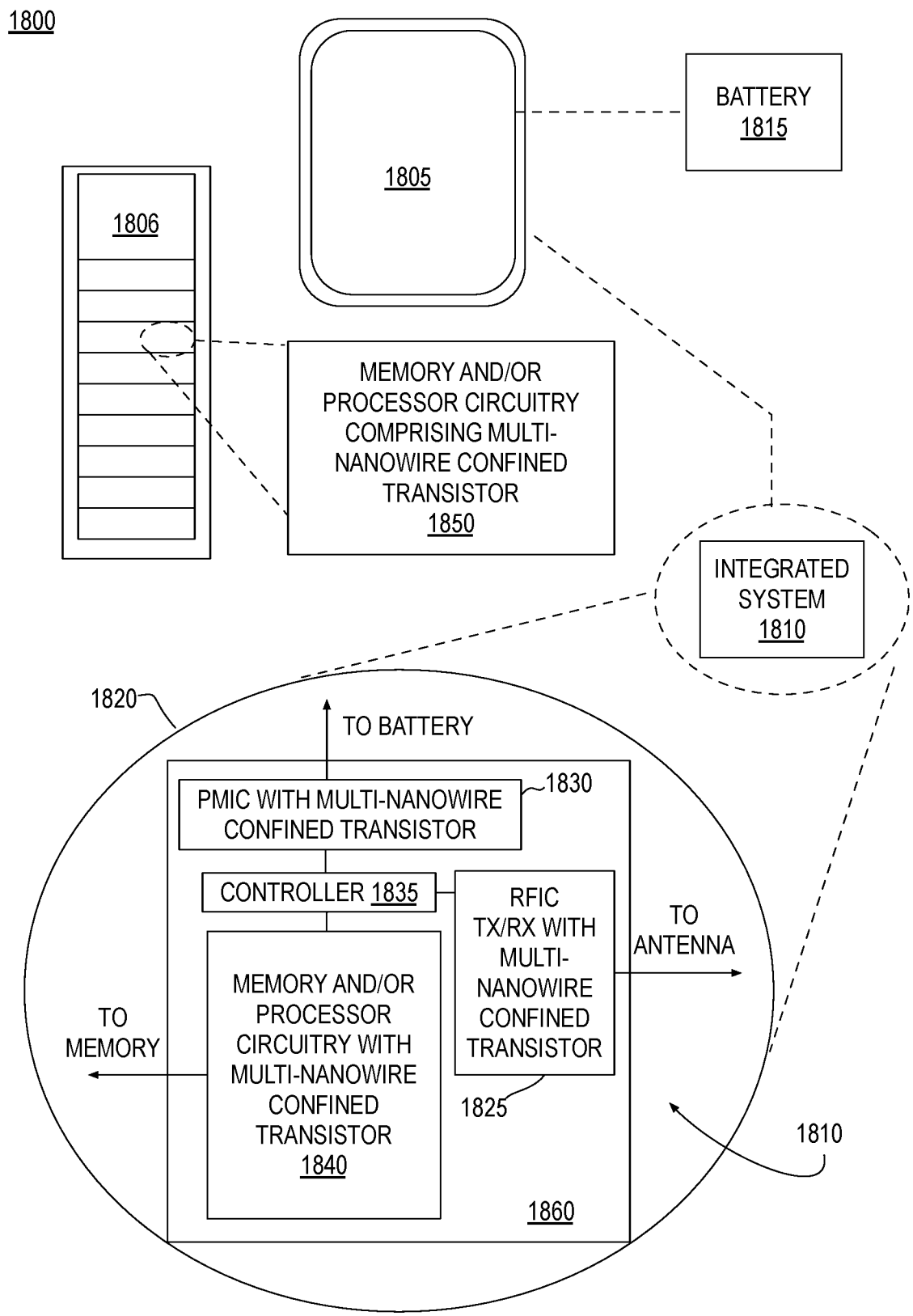
FIG. 18 illustrates a system in which a mobile computing platform and/or a data server machine employs a transistor structure having a fin structure with interleaved graded III-N material and polarization layers.

FIG. 18 illustrates a system 1800 in which a mobile computing platform 1805 and/or a data server machine 1806 employs a transistor structure having a fin structure with interleaved graded III-N material and polarization layers, arranged in accordance with at least some implementations of the present disclosure. Data server machine 1806 may be any commercial server, for example, including any number of high-performance computing platforms disposed within a rack and networked together for electronic data processing, which in the exemplary embodiment includes a packaged device 1850. For example, device 1850 (e.g., a memory or processor) may include a transistor structure having a fin structure with interleaved graded III-N material and polarization layers (labeled as "multi-nanowire confined transistor" in FIG. 18). In some examples, device 1850 may include a system on a chip (SOC) such as SOC 1860, which is illustrated with respect to mobile computing platform 1805.

Mobile computing platform 1805 may be any portable device configured for each of electronic data display, electronic data processing, wireless electronic data transmission, or the like. For example, mobile computing platform 1805 may be any of a tablet, a smart phone, a laptop computer, etc., and may include a display screen (e.g., a capacitive, inductive, resistive, or optical touchscreen), a chip-level or package-level integrated system 1810, and a battery 1815. Although illustrated with respect to mobile computing platform 1805, in other examples, chip-level or package-level integrated system 1810 and a battery 1815 may be implemented in a desktop computing platform, an automotive computing platform, an internet of things platform, or the like.

Whether disposed within integrated system 1810 illustrated in expanded view 1820 or as a stand-alone packaged device within data server machine 1806, SOC 1860 may include memory circuitry and/or processor circuitry 1840 (e.g., RAM, a microprocessor, a multi-core microprocessor, graphics processor, etc.), a PMIC 1830, a controller 1835, and a radio frequency integrated circuit (RFIC) 1825 (e.g., including a wideband RF transmitter and/or receiver (TX/RX)). As shown, one or more transistor structures having a fin structure with interleaved graded III-N material and polarization layers as discussed herein may be employed via memory circuitry and/or processor circuitry 1840. In some embodiments, RFIC 1825 includes a digital baseband and an analog front-end module further comprising a power amplifier on a transmit path and a low noise amplifier on a receive path). As shown, one or more transistor structures having a fin structure with interleaved graded III-N material and polarization layers as discussed herein may be employed via RFIC 1825. Functionally, PMIC 1830 may perform battery power regulation, DC-to-DC conversion, etc., and so has an input coupled to battery 1815, and an output providing a current supply to other functional modules. As shown, one or more transistor structures having a fin structure with interleaved graded III-N material and polarization layers as discussed herein may be employed via PMIC 1830. As further illustrated in FIG. 18, in the exemplary embodiment, RFIC 1825 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In an embodiment, RFIC 1825 is a wireless transceiver operable in the GHz band. Memory circuitry and/or processor circuitry 1840 may provide memory functionality for SOC 1860, high level control, data processing and the like for SOC 1860. In alternative implementations, each of the SOC modules may be integrated onto separate ICs coupled to a package substrate, interposer, or board.

Figure 19:
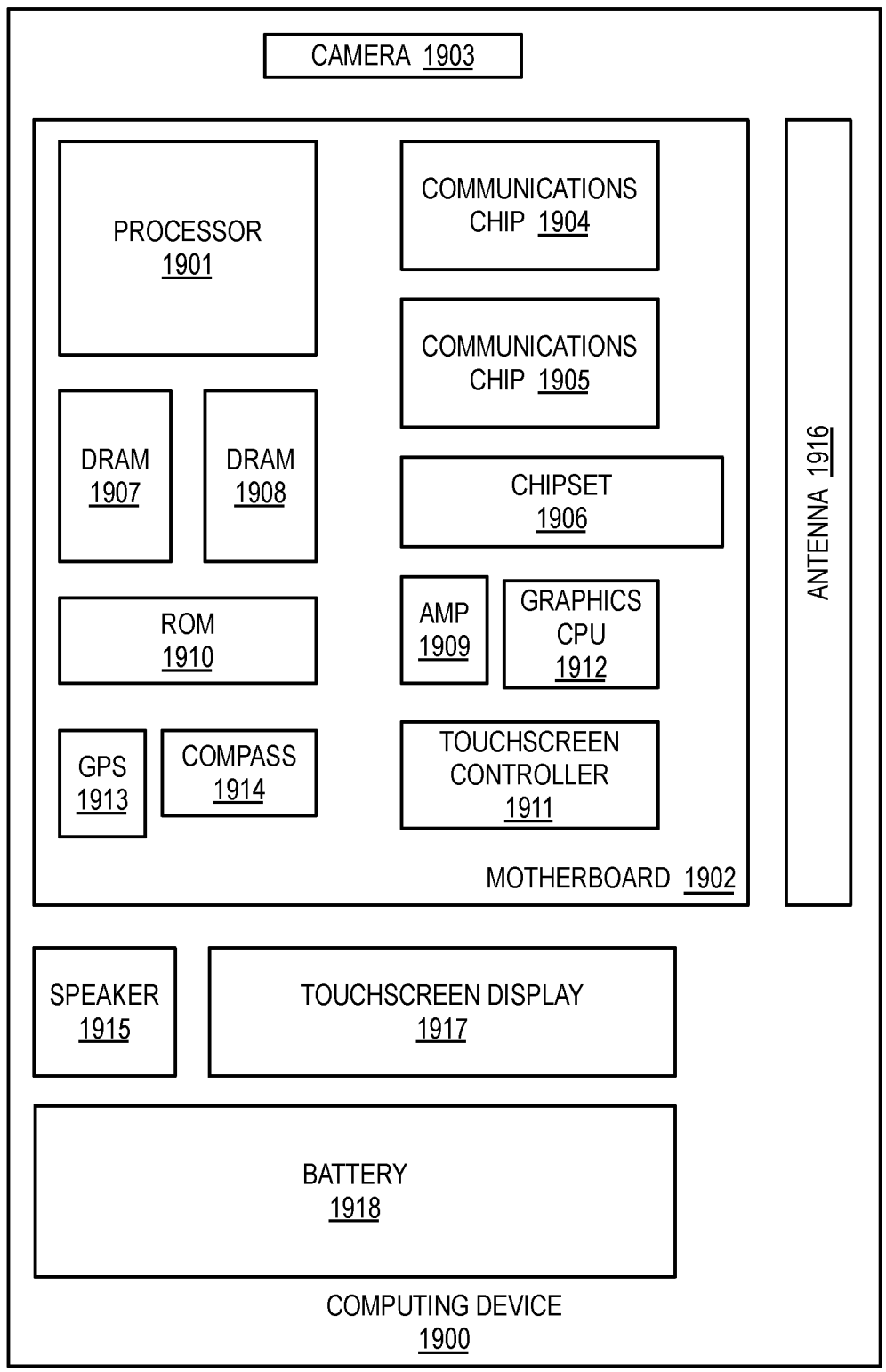
FIG. 19 illustrates a functional block diagram of a computing device, all arranged in accordance with at least some implementations of the present disclosure.

FIG. 19 is a functional block diagram of a computing device 1900, arranged in accordance with at least some implementations of the present disclosure. Computing device 1900 or portions thereof may be implemented via one or both of data server machine 1806 or mobile computing platform 1805, for example, and further includes a motherboard 1902 hosting a number of components, such as but not limited to a processor 1901 (e.g., an applications processor) and one or more communications chips 1904, 1905. Processor 1901 may be physically and/or electrically coupled to motherboard 1902. In some examples, processor 1901 includes an integrated circuit die packaged within the processor 1901. In general, the term "processor" may refer to any device or portion of a device that processes electronic data from registers and/or memory to transform that electronic data into other electronic data that may be stored in registers and/or memory.

In various examples, one or more communication chips 1904, 1905 may also be physically and/or electrically coupled to the motherboard 1902. In further implementations, communication chips 1904 may be part of processor 1901. Depending on its applications, computing device 1900 may include other components that may or may not be physically and electrically coupled to motherboard 1902. These other components may include, but are not limited to, volatile memory (e.g., DRAM) 1907, 1908, non-volatile memory (e.g., ROM) 1910, a graphics processor 1912, flash memory, global positioning system (GPS) device 1913, compass 1914, a chipset 1906, an antenna 1916, a power amplifier 1909, a touchscreen controller 1911, a touchscreen display 1917, a speaker 1915, a camera 1903, and a battery 1918, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 1904, 1905 may enable wireless communications for the transfer of data to and from the computing device 1900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1904, 1905 may implement any of a number of wireless standards or protocols, including but not limited to those described elsewhere herein. As discussed, computing device 1900 may include a plurality of communication chips 1904, 1905. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. For example, any component of computing device 1900 may include or utilize one or more transistor structures having a fin structure with interleaved graded III-N material and polarization layers as discussed herein.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure. It will be recognized that the invention is not limited to the embodiments so described but can be practiced with modification and alteration without departing from the scope of the appended claims. For example, the above embodiments may include specific combinations of features as further provided below.

The following examples pertain to further embodiments.

In one or more first embodiments, a transistor structure comprises a fin structure comprising first and second graded group III-nitride (III-N) material layers with a polarization layer therebetween, the first graded III-N material layer comprising first and second group III constituents, wherein the first graded III-N material layer comprises a graded first group III constituent concentration profile with a decreasing concentration of the first group III constituent along a height of the fin structure, a source and a drain coupled to the fin structure, and a gate between the source and the drain and coupled to the fin structure.

In one or more second embodiments, for any of the first embodiments, the first graded III-N material layer comprises indium gallium nitride, the first group III constituent comprises indium, and the graded first group III constituent concentration profile comprises an indium concentration of not less than 15% in a first region of the first graded III-N material layer distal from the polarization layer and not more than 1% in a second region of the first graded III-N material layer proximal to the polarization layer.

In one or more third embodiments, for any of the first or second embodiments, the indium concentration in the second region is 0% and the second region comprises gallium nitride.

In one or more fourth embodiments, for any of the first through third embodiments, the first graded III-N material layer comprises indium gallium nitride, the first group III constituent comprises indium, and the graded first group III constituent concentration profile comprises an indium concentration of not less than 99% in a first region of the first graded III-N material layer distal from the polarization layer and not more than 50% in a second region of the first graded III-N material layer proximal to the polarization layer.

In one or more fifth embodiments, for any of the first through fourth embodiments, the polarization layer is on the first graded III-N material layer, the second graded III-N material layer is on the polarization layer, and the fin structure further comprises a second polarization layer on the second graded III-N material layer, a third graded III-N material layer on the second polarization layer, and a third polarization layer on the third graded III-N material layer.

In one or more sixth embodiments, for any of the first through fifth embodiments, the first, second, and third graded III-N material layers each comprise indium gallium nitride having graded concentration profiles comprising indium concentrations of not less than 15% at base regions of the first, second, and third graded III-N material layers and not more than 1% at top regions of the first, second, and third graded III-N material layers.

In one or more seventh embodiments, for any of the first through sixth embodiments, the graded first group III constituent concentration profile comprises a first concentration per depth rate of change of the first group III constituent proximal to a top surface of the first graded III-N material layer and a second concentration per depth rate of change of the first group III constituent proximal to a bottom surface of the first graded III-N material layer, wherein both the first and second per depth rate of changes are along a depth of the fin structure opposite the height of the fin structure, and wherein the first concentration per depth rate of change is greater than the second concentration per depth rate of change.

In one or more eighth embodiments, for any of the first through seventh embodiments, the polarization layer comprises aluminum indium gallium nitride having an aluminum concentration of not less than 70% and an indium concentration of not more than 17%.

In one or more ninth embodiments, for any of the first through eighth embodiments, the fin structure has a width of not more than 6 nm, the first and second graded III-N material layers have heights of not less than 5 nm and not more than 30 nm, and the polarization layer has a height of not less than 1 nm and not more than 4 nm.

In one or more tenth embodiments, for any of the first through ninth embodiments, the transistor structure further comprises a second fin structure substantially parallel to the fin structure, the second fin structure comprising third and fourth graded III-N material layers and a second polarization layer therebetween, wherein the source, the drain, and the gate are coupled to the second fin structure, and wherein the third graded III-N material layer comprises the graded first group III constituent concentration profile.

In one or more eleventh embodiments, for any of the first through tenth embodiments, the transistor structure further comprises first and second sidewall structures on at least a first base portion of the fin structure and third and fourth sidewall structures on at least a second base portion of the second fin structures and a field insulator between the first sidewall structure and the third sidewall structure and under the source.

In one or more twelfth embodiments, for any of the first through eleventh embodiments, a system includes a memory and an integrated circuit coupled to the memory, the integrated circuit including a transistor structure according to any of the first through eleventh embodiments.

In one or more thirteenth embodiments, for any of the first through twelfth embodiments, the integrated circuit comprises a wireless transceiver operable in the GHz band.

In one or more fourteenth embodiments, for any of the first through thirteenth embodiments, the system further includes a battery coupled to the integrated circuit.

In one or more fifteenth embodiments, for any of the first through fourteenth embodiments, a system includes a means for storing data and a means for processing the stored data coupled to the means for storing data, the means for processing including a transistor structure according to any of the first through eleventh embodiments.

In one or more seventeenth embodiments, a method of forming a transistor structure comprises growing, over a substrate, a first graded III-N material layer, a polarization layer, and a second graded III-N material layer, wherein the polarization layer is between the first and second graded III-N material layers, the first graded III-N material layer comprises first and second group III constituents, and the first graded III-N material layer comprises a graded first group III constituent concentration profile with a decreasing concentration of the first group III constituent along a height extending from the substrate, patterning the first graded III-N material layer, the polarization layer, and the second graded III-N material layer to form a fin structure, forming a gate coupled to the fin structure, and forming a source and a drain coupled to the fin structure, wherein the gate is between the source and the drain.

In one or more eighteenth embodiments, for any of the seventeenth embodiments, the first graded III-N material layer comprises indium gallium nitride, the first group III constituent comprises indium, and the graded first group III constituent concentration profile comprises an indium concentration of not less than 15% in a first region of the first graded III-N material layer distal from the polarization layer and not more than 1% in a second region of the first graded III-N material layer proximal to the polarization layer.

In one or more nineteenth embodiments, for any of the seventeenth or eighteenth embodiments, the first graded III-N material layer comprises indium gallium nitride, the first group III constituent comprises indium, and the graded first group III constituent concentration profile comprises an indium concentration of not less than 99% in a first region of the first graded III-N material layer distal from the polarization layer and not more than 50% in a second region of the first graded III-N material layer proximal to the polarization layer.

In one or more twentieth embodiments, for any of the seventeenth through nineteenth embodiments, the method further comprises patterning the first graded III-N material layer, the polarization layer, and the second graded III-N material layer to form a second fin structure substantially parallel with the fin structure, forming, prior to said forming the source and the drain, first and second sidewall structures on at least a first base portion of the fin structure and third and fourth sidewall structures on at least a second base portion of the second fin structures, and providing a field insulator between the first sidewall structure and the third sidewall structure and under the source.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:

1. A transistor structure comprising:
   a fin structure comprising first and second graded group III-nitride (III-N) material layers with a polarization layer therebetween, the first graded III-N material layer comprising first and second group III constituents, wherein the first graded III-N material layer comprises a graded first group III constituent concentration profile with a decreasing concentration of the first group III constituent along a height of the fin structure;
   a source and a drain coupled to the fin structure; and
   a gate between the source and the drain and coupled to the fin structure.

2. The transistor structure of claim 1, wherein the first graded III-N material layer comprises indium gallium nitride, the first group III constituent comprises indium, and the graded first group III constituent concentration profile comprises an indium concentration of not less than 15% in a first region of the first graded III-N material layer distal from the polarization layer and not more than 1% in a second region of the first graded III-N material layer proximal to the polarization layer.

3. The transistor structure of claim 2, wherein the indium concentration in the second region is 0% and the second region comprises gallium nitride.

4. The transistor structure of claim 1, wherein the first graded III-N material layer comprises indium gallium nitride, the first group III constituent comprises indium, and the graded first group III constituent concentration profile comprises an indium concentration of not less than 99% in a first region of the first graded III-N material layer distal from the polarization layer and not more than 50% in a second region of the first graded III-N material layer proximal to the polarization layer.

5. The transistor structure of claim 1, wherein the polarization layer is on the first graded III-N material layer, the second graded III-N material layer is on the polarization layer, and the fin structure further comprises a second polarization layer on the second graded III-N material layer, a third graded III-N material layer on the second polarization layer, and a third polarization layer on the third graded III-N material layer.

6. The transistor structure of claim 5, wherein the first, second, and third graded III-N material layers each comprise indium gallium nitride having graded concentration profiles comprising indium concentrations of not less than 15% at base regions of the first, second, and third graded III-N material layers and not more than 1% at top regions of the first, second, and third graded III-N material layers.

7. The transistor structure of claim 1, wherein the graded first group III constituent concentration profile comprises a first concentration per depth rate of change of the first group III constituent proximal to a top surface of the first graded III-N material layer and a second concentration per depth rate of change of the first group III constituent proximal to a bottom surface of the first graded III-N material layer, wherein both the first and second per depth rate of changes are along a depth of the fin structure opposite the height of the fin structure, and wherein the first concentration per depth rate of change is greater than the second concentration per depth rate of change.

8. The transistor structure of claim 1, wherein the polarization layer comprises aluminum indium gallium nitride having an aluminum concentration of not less than 70% and an indium concentration of not more than 17%.

9. The transistor structure of claim 1, wherein the fin structure has a width of not more than 6 nm, the first and second graded III-N material layers have heights of not less than 5 nm and not more than 30 nm, and the polarization layer has a height of not less than 1 nm and not more than 4 nm.

10. The transistor structure of claim 1, further comprising:
    a second fin structure substantially parallel to the fin structure, the second fin structure comprising third and fourth graded III-N material layers and a second polarization layer therebetween, wherein the source, the drain, and the gate are coupled to the second fin structure, and wherein the third graded III-N material layer comprises the graded first group III constituent concentration profile.

11. The transistor structure of claim 10, further comprising:
- first and second sidewall structures on at least a first base portion of the fin structure and third and fourth sidewall structures on at least a second base portion of the second fin structures; and
- a field insulator between the first sidewall structure and the third sidewall structure and under the source.

12. A system comprising:
- a memory; and
- an integrated circuit coupled to the memory, the integrated circuit comprising a transistor structure comprising:
  - a fin structure comprising first and second graded group III-nitride (III-N) material layers with a polarization layer therebetween, the first graded III-N material layer comprising first and second group III constituents, wherein the first graded III-N material layer comprises a graded first group III constituent concentration profile with a decreasing concentration of the first group III constituent along a height of the fin structure;
  - a source and a drain coupled to the fin structure; and
  - a gate between the source and the drain and coupled to the fin structure.

13. The system of claim 12, wherein the first graded III-N material layer comprises indium gallium nitride, the first group III constituent comprises indium, and the graded concentration profile comprises an indium concentration of not less than 15% in a first region of the first graded III-N material layer distal from the polarization layer and not more than 1% in a second region of the first graded III-N material layer proximal to the polarization layer.

14. The system of claim 12, wherein the first graded III-N material layer comprises indium gallium nitride, the first group III constituent comprises indium, and the graded concentration profile comprises an indium concentration of not less than 99% in a first region of the first graded III-N material layer distal from the polarization layer and not more than 50% in a second region of the first graded III-N material layer proximal to the polarization layer.

15. The system of claim 12, wherein the integrated circuit comprises a wireless transceiver operable in the GHz band.

16. The system of claim 12, further comprising a battery coupled to the integrated circuit.

17. A method of forming a transistor structure comprising:
- growing, over a substrate, a first graded III-N material layer, a polarization layer, and a second graded III-N material layer, wherein the polarization layer is between the first and second graded III-N material layers, the first graded III-N material layer comprises first and second group III constituents, and the first graded III-N material layer comprises a graded first group III constituent concentration profile with a decreasing concentration of the first group III constituent along a height extending from the substrate;
- patterning the first graded III-N material layer, the polarization layer, and the second graded III-N material layer to form a fin structure;
- forming a gate coupled to the fin structure; and
- forming a source and a drain coupled to the fin structure, wherein the gate is between the source and the drain.

18. The method of forming the transistor structure of claim 17, wherein the first graded III-N material layer comprises indium gallium nitride, the first group III constituent comprises indium, and the graded first group III constituent concentration profile comprises an indium concentration of not less than 15% in a first region of the first graded III-N material layer distal from the polarization layer and not more than 1% in a second region of the first graded III-N material layer proximal to the polarization layer.

19. The method of forming the transistor structure of claim 17, wherein the first graded III-N material layer comprises indium gallium nitride, the first group III constituent comprises indium, and the graded first group III constituent concentration profile comprises an indium concentration of not less than 99% in a first region of the first graded III-N material layer distal from the polarization layer and not more than 50% in a second region of the first graded III-N material layer proximal to the polarization layer.

20. The method of forming the transistor structure of claim 17, further comprising:
- patterning the first graded III-N material layer, the polarization layer, and the second graded III-N material layer to form a second fin structure substantially parallel with the fin structure;
- forming, prior to said forming the source and the drain, first and second sidewall structures on at least a first base portion of the fin structure and third and fourth sidewall structures on at least a second base portion of the second fin structures; and
- providing a field insulator between the first sidewall structure and the third sidewall structure and under the source.

* * * * *